United States Patent
Lee et al.

(10) Patent No.: US 8,835,851 B2
(45) Date of Patent: Sep. 16, 2014

(54) PLASMONIC DETECTORS

(75) Inventors: Seung-Chang Lee, Albuquerque, NM (US); Sanjay Krishna, Albuquerque, NM (US); Steven Brueck, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 152 days.

(21) Appl. No.: 13/502,987

(22) PCT Filed: Oct. 21, 2010

(86) PCT No.: PCT/US2010/053553
§ 371 (c)(1),
(2), (4) Date: Apr. 19, 2012

(87) PCT Pub. No.: WO2011/050165
PCT Pub. Date: Apr. 28, 2011

(65) Prior Publication Data
US 2012/0205541 A1    Aug. 16, 2012

Related U.S. Application Data

(60) Provisional application No. 61/279,435, filed on Oct. 21, 2009, provisional application No. 61/339,185, filed on Mar. 1, 2010.

(51) Int. Cl.
| | |
|---|---|
| H01L 27/14 | (2006.01) |
| H01L 31/0304 | (2006.01) |
| B82Y 20/00 | (2011.01) |
| H01L 27/144 | (2006.01) |
| H01L 31/103 | (2006.01) |
| H01L 31/0352 | (2006.01) |
| G02B 6/122 | (2006.01) |
| G01J 5/08 | (2006.01) |

(52) U.S. Cl.
CPC .. *H01L 31/035236* (2013.01); *H01L 31/03046* (2013.01); *G02B 6/1226* (2013.01); *G01J 5/0853* (2013.01); *B82Y 20/00* (2013.01); *H01L 27/1446* (2013.01); *H01L 31/1035* (2013.01); *Y02E 10/544* (2013.01)
USPC ................................................ 250/338.4

(58) Field of Classification Search
CPC ...... G01J 5/024; G01J 5/02; H01L 31/02327; H01L 27/1446; H01L 27/144
USPC ....................................................... 250/338.4
See application file for complete search history.

(56) References Cited

U.S. PATENT DOCUMENTS

2004/0159775 A1    8/2004  Sundaram et al.
2006/0175551 A1*   8/2006  Fan et al. .................... 250/353
(Continued)

FOREIGN PATENT DOCUMENTS

| JP | 2005308658 | 11/2005 |
| JP | 2009150748 | 7/2009 |
| JP | 2009150749 | 7/2009 |

*Primary Examiner* — Marcus Taningco
(74) *Attorney, Agent, or Firm* — MH2 Technology Law Group, LLP

(57) ABSTRACT

A plasmonic detector is described which can resonantly enhance the performance of infrared detectors. More specifically, the disclosure is directed to enhancing the quantum efficiency of semiconductor infrared detectors by increasing coupling to the incident radiation field as a result of resonant coupling to surface plasma waves supported by the metal/semiconductor interface, without impacting the dark current of the device, resulting in an improved detectivity over the surface plasma wave spectral bandwidth.

20 Claims, 14 Drawing Sheets

(56) References Cited

U.S. PATENT DOCUMENTS

| | | |
|---|---|---|
| 2008/0212102 A1 | 9/2008 | Nuzzo et al. |
| 2009/0052827 A1* | 2/2009 | Durfee et al. ............ 385/2 |
| 2010/0033725 A1* | 2/2010 | Quesnel et al. ......... 356/445 |
| 2010/0239821 A1* | 9/2010 | Nagao et al. ............ 428/172 |

* cited by examiner

PLASMONIC DETECTORS

RELATED APPLICATIONS

This application claims priority from U.S. Provisional Patent Application Ser. Nos. 61/279,435, filed Oct. 21, 2009 and 61/339,185, filed Mar. 1, 2010, which are hereby incorporated by reference in their entirety.

FIELD OF THE INVENTION

This invention relates generally to plasmonic detectors and, more specifically, to plasmonic structures and their use in resonantly enhancing the performance of infrared detectors.

BACKGROUND OF THE INVENTION

There is an increased emphasis on developing detectors with enhanced functionality at the pixel level. This can manifest itself as spectral, polarization, dynamic range or phase.

The important parameters of infrared detectors of course vary with application but include quantum efficiency (the fraction of incident photons contributing to the collection of an electrical signal), dark current (the current in the absence of an optical signal), and spectral bandwidth (the range of wavelengths over which the signal is received). Typical semiconductor photodetectors (InSb, HgCdTe, InAs/GaAs), quantum well infrared photodetectors (QWIPs), InAs/GaAs quantum dot infrared photodetectors (QDIPs), and InAs/GaSb strained layer superlattices have relatively broad spectral bandwidths of several micrometers or more. QWIPs and QDIPs typically have relatively low quantum efficiencies as a result of the low absorption cross section of an individual well or dot and limitations to stacking multiple wells or dots associated with the heterogeneous growth and the resulting strain limitations.

The exemplary embodiments herein enhance the quantum efficiency of QWIP and QDIP detectors by increasing coupling to the incident radiation field as a result of resonant coupling to surface plasma waves supported by the metal/semiconductor interface, without impacting the dark current of the device, resulting in an improved detectivity over the surface plasma wave spectral bandwidth. This concept is also applicable to SLS and bulk semiconductor devices by reducing a thickness of the active region, thereby reducing the quantum efficiency and the dark current, which is often proportional to the active volume, and regaining the quantum efficiency with the surface plasma wave coupling.

In some applications, spectral and polarization information is important. Today this is often accomplished with external optical elements (filters and polarizers) that add significantly to the cost, size, weight and power requirements (SWaP), and mechanical complexity of the infrared array implementation. As disclosed herein, the exemplary embodiments integrate the spectral and polarization selective elements directly on the detector array elements, thereby eliminating the added cost, SWaP and mechanical complexity.

SUMMARY

The exemplary embodiments relate to the coupling of plasmonic structures with infrared detectors for improved device performance such as, but not limited to, spectral control, polarization control, dynamic range control, local field enhancement and phase control.

DETAILED DESCRIPTION

Recently, the optical properties of a thin metal film perforated by a 2D array of holes, a metal photonic crystal (MPC), and of a corrugated metal surface (CMS) with a similar structure, but metal or dielectric posts in place of the holes of the MPC, and the role of surface plasma waves (SPW) in the extraordinary optical transmission of this MPC (or dip in the reflectivity of the CMS) have been studied extensively. The SPW, bound to the metal/dielectric interface, have evanescent fields that decay exponentially away from the interface into both the metal and the dielectric. Resonances are observed when a wavevector corresponding to the 2D Fourier transform of the MPC or CMS array structure provides phase-matching between the incident photon and SPWs at either of the metal/air or the metal/dielectric interface. These interactions can be used to improve the performance of both optical emitters and detectors.

The details of the coupling of incident radiation to the SPW are sensitive to the periods of the metal structures, the sizes of the holes or posts, the thicknesses of the metal and holes and of the posts, the presence of additional films such as a low index dielectric film between the semiconductor and the metal structure, and the optical properties, including absorption, of the underlying semiconductor device. These details can be adjusted to optimize the coupling for a particular application. In the following, specific detail is provided for existing experimental demonstration devices; these examples are provided for specificity and are not intended to restrict the application of the invention.

The detectors coupled to SPWs can impact infrared spectral imagery which is increasingly important for many remote sensing problems including defeating camouflage, remote identification and tracking of chemical and biological compounds, and anomaly detection. This spectral imagery can take on many forms, ranging from two-color infrared imagery that is useful for applications, for example, locating recently disturbed earth, to multispectral imagery (MSI) where a small number of bands (usually 3-15) are spread out across the spectrum, or to hyperspectral imagery where a detailed spectral measurement is made at every pixel of a focal plane array (FPA).

As a first example, the coupling effects of the SPW excited at the MPC/detector interface can be measured through the contribution to the photoresponse of a quantum dot infrared photodetector (QDIP) of which the absorption region is located within the transverse extent of the SPW. A dramatic, 30-fold increase in the photoresponse can be found at the resonance wavelength of the SPW coupling. The SPW response interacting with the quantum confined Stark (QCS) effect in the QDs provides a unique spectral response tuning mechanism that offers a new and powerful integrated approach, easily adaptable to large FPAs as will be further described in subsequent figures.

Figures 1A, 1B:
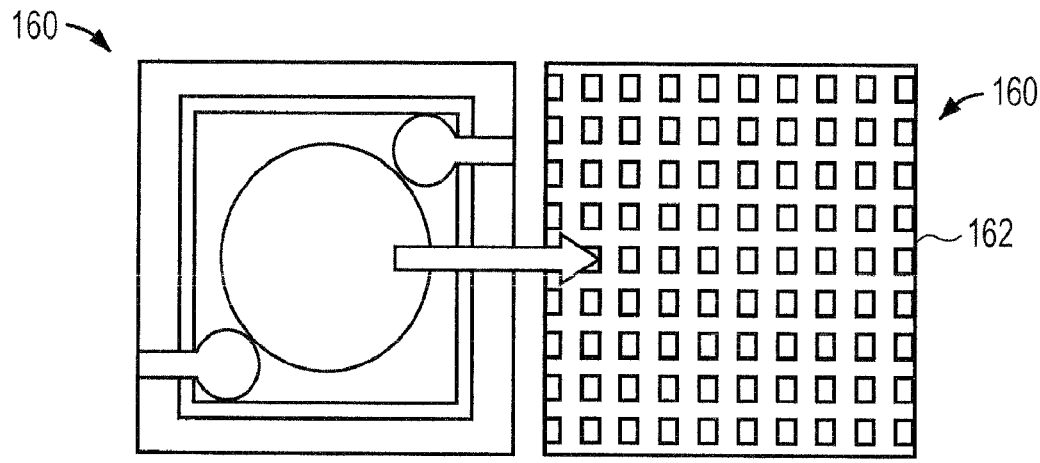
FIG. 1A shows a schematic of the MPC device (left) and FIG. 1B shows the details of the exemplary MPC of FIG. 1A magnified 16 times. The period of the square holes is 3.6 μm.
Figure 1C:
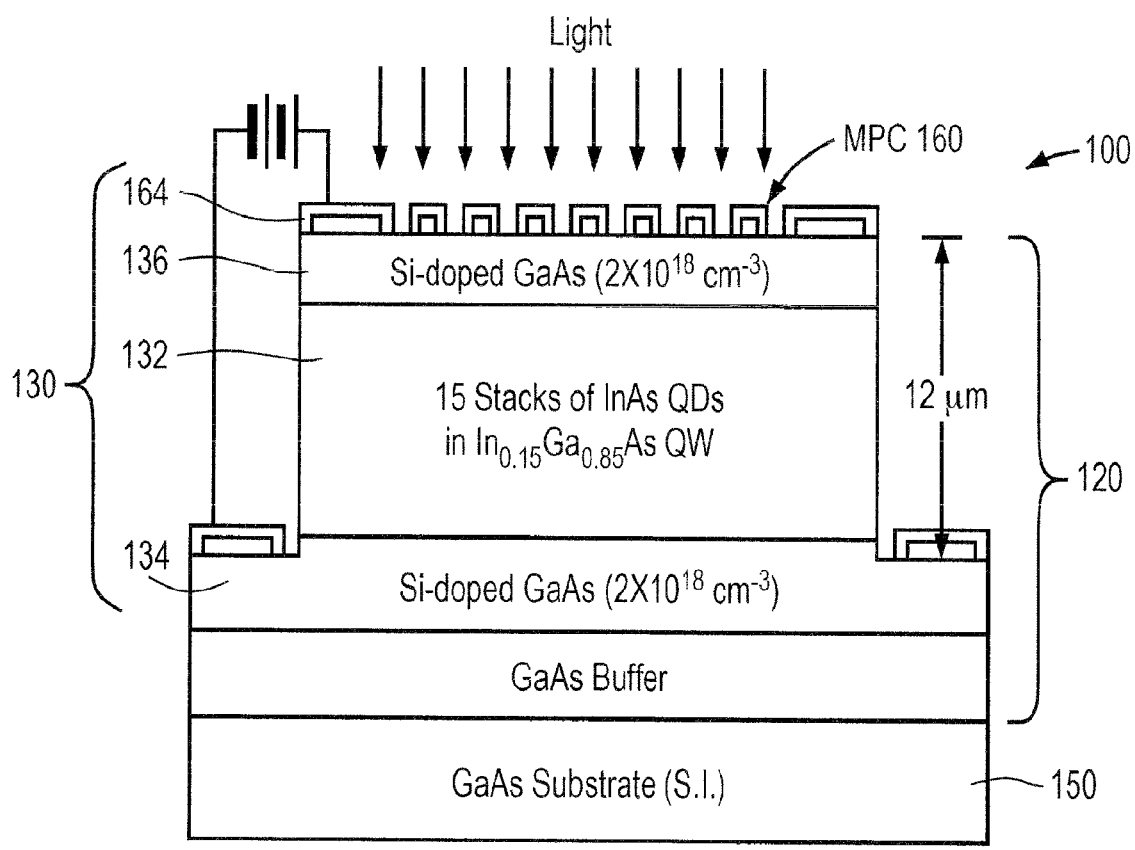
FIG. 1C shows a schematic cross sectional structure of an exemplary MPC device.

FIGS. 1A and 1B show a schematic top view of an MPC 160, with FIG. 1B being magnified by about 15 times relative to FIG. 1A, and FIG. 1C shows a schematic cross sectional view of an MPC-integrated device 100. It should be readily apparent to one of ordinary skill in the art that the MPC and MPC-integrated device 100 depicted in FIGS. 1A through 1C represent generalized schematic illustrations and that other components can be added or existing components can be removed or modified.

The MPC-integrated device 100 can include a QDIP 120 grown on a GaAs substrate 150 and the MPC 160 formed on the QDIP 120.

The MPC 160 is a 100 nm-thick Au film perforated with a 3.6 μm period square array of circular holes 162, each hole having diameter of about 1.65±0.05 μm. For a gold MPC 160 having a square-symmetry hole period, p, integrated on a QDIP grown on a GaAs substrate, the SP resonance wavelengths, $\lambda_{ij}$, at the MPC/detector interface, are given as:

$$\lambda_{ij} = \frac{p}{\sqrt{i^2+j^2}} \text{Re}\left\{ \left[ \frac{\varepsilon_m \varepsilon_d}{\varepsilon_m + \varepsilon_d} \right]^{1/2} \right\} \tag{1}$$

where the pair of integers, i and j, in Eq. (1) corresponds to the harmonic of the 2D grating wavevector in the orthogonal spatial directions, $\varepsilon_d = \varepsilon_d' + \varepsilon_d''$ and $\varepsilon_m = \varepsilon_m' + i\varepsilon_m''$ correspond to the dielectric constants of the QDIP material (including the intraband absorption) and the Au film at a given resonance wavelength. The thickness of the MPC 160 in the present invention is considerably greater than the skin depth to avoid direct transmission through the film. For convenience, $\lambda_{01}(=\lambda_{10})$, $\lambda_{11}$, $\lambda_{02}(=\lambda_{20})$, and $\lambda_{12}(=\lambda_{21})$ are referred to as the resonance wavelengths of the SP modes excited at MPC/detector interface, respectively. For normal incidence, these resonance wavelengths are approximately given by: $n_d p$, $n_d p/\sqrt{2}$, $n_d p/2$, and $n_d p/\sqrt{5}$ where $n_d = \sqrt{\varepsilon_d}$. As seen below, the period of 3.6 μm was chosen to align the fundamental resonance ($n_d p$) with the long wavelength edge of the QDIP response so that there would be a large response variation associated with the QCS bias dependence.

As shown in FIG. 1C, the MPC 160 is integrated atop a QDIP 120 in which an absorption region 130 consists of 15 stacks of InAs quantum dots (QD) 132 buried in undoped In$_{0.15}$Ga$_{0.85}$As quantum well (QW) layers 134, 136. The total thickness of the absorption region 130 is 980 nm. A 10 nm-thick Cr film (not shown) can be deposited between the MPC 160 and the QDIP 120 to promote the adhesion of the Au film to the top GaAs layer 136. The device size is about 410× about 410 μm² and the diameter of the detector aperture or the lateral dimension of the MPC 160 is about 300 μm. The distance from the MPC/detector interface to the end of the absorption region is about 1.2 μm.

FIG. 1C schematically shows a diagram with positive bias (e.g. forward bias) to a top contact 164 at the MPC 160. This MPC-integrated QDIP 100 (MPC device) is compared with a reference QDIP without an MPC (reference device). Both devices were taken from a single die of the same growth and therefore their intrinsic response and performance are assumed to be very similar. The QDIP 120 was grown on a semi-insulating GaAs(001) substrate 150 by molecular beam epitaxy. Standard photolithography and electron-beam metal deposition were employed for the fabrication of these devices and the MPC 160. The low temperature photoresponse (10K) was measured using a Nicolet 6700 Fourier transform infrared spectrometer and a Stanford Research Systems SR FFT 770 network analyzer. The bias applied to the devices was varied from −5 to 5 V.

Figure 2A:
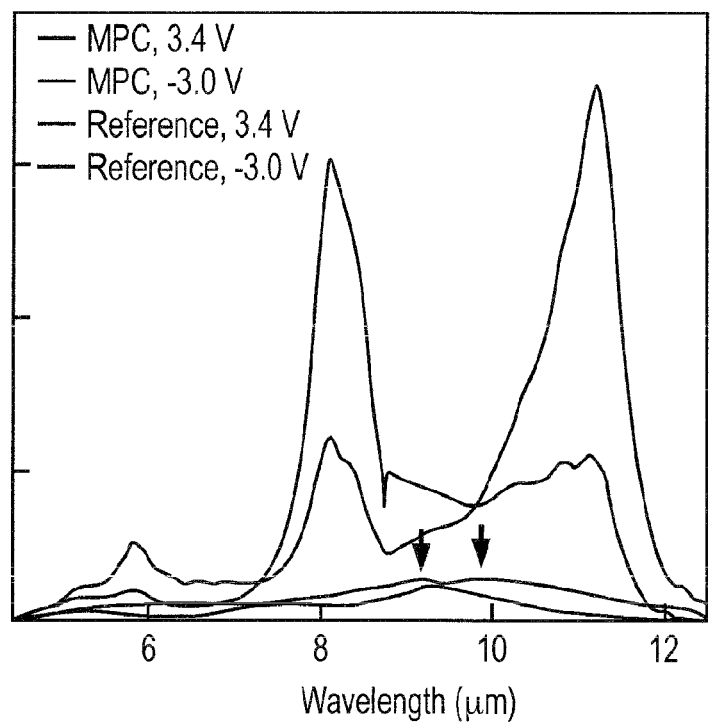
FIG. 2A shows spectral response curves of the reference device (two spectra at the bottom with the arrows indicating the highest peak in each spectrum) and an exemplary MPC device (other two spectra with higher responsivity) for −3.0 V and 3.4 V at 10 K.

FIG. 2A shows the spectral response of the two devices at −3.0 and 3.4 V, respectively. As indicated by the arrows in the figure, the reference device exhibits two rather broad and indistinct peaks for both −3.0 V (the highest at 9.9 μm and a second at 7.3 μm), and 3.4 V (the highest at 9.2 μm and a second at 5.5 μm). This two color response agrees with previous reports. The peak shifts with applied voltage have been interpreted as a QCS effect. On the other hand, the MPC device has four peaks at identical wavelengths for both biases. The peak at 11.3 μm, which is much stronger than that of the reference detector, is dominant for reverse bias while the peak at 8.1 μm is more intense than any other peaks for forward bias. The two remaining peaks at 5.8 and 5.4 μm are relatively weak. In FIG. 2A, therefore, the MPC device has totally different spectral response from the reference device in both peak wavelength and especially response intensity.

Figure 3A:
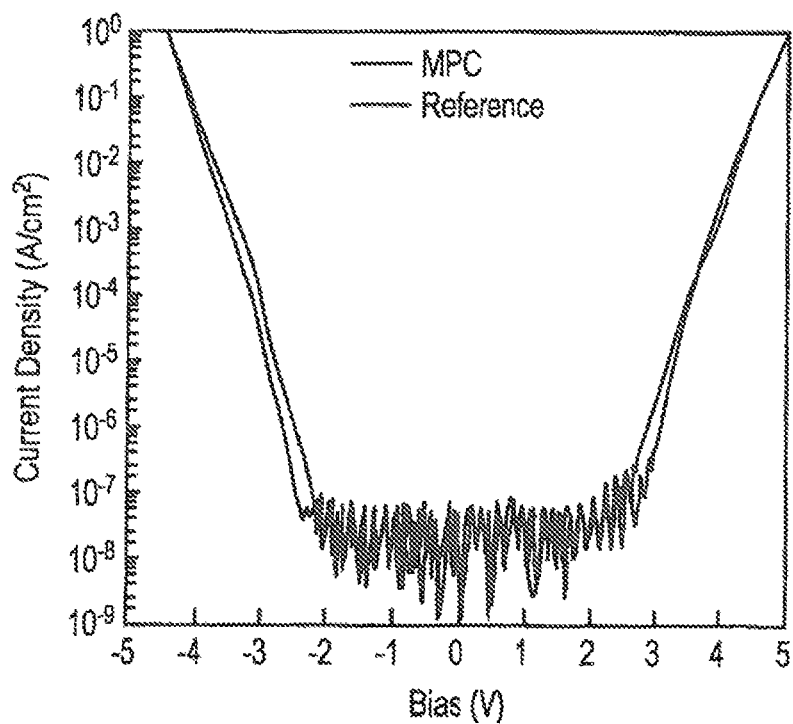
FIG. 3A shows I-V characteristics.

FIG. 3A presents the I-V characteristics of two devices, where the MPC device exhibits a somewhat higher background current density than the reference device at the same bias. The current density of the MPC device at −3V is, for example, $7.2 \times 10^{-5}$ A/cm$^2$, greater than $1.6 \times 10^{-5}$ A/cm$^2$ of the reference device at the same bias. The flat region between −2.0 and 2.5 V is the noise floor of our instrumentation.

Figure 3B:
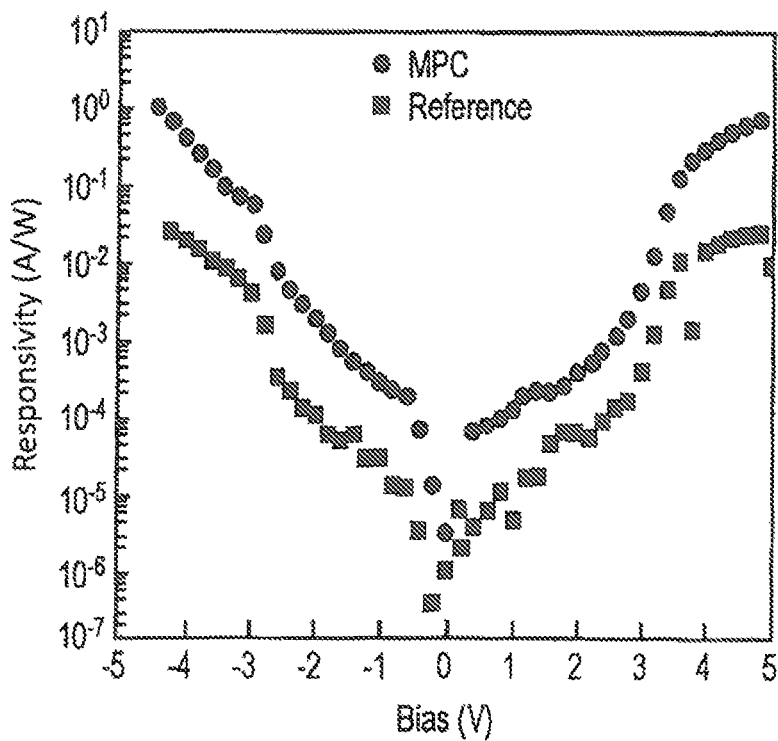
FIG. 3B shows the responsivity.
Figure 3C:
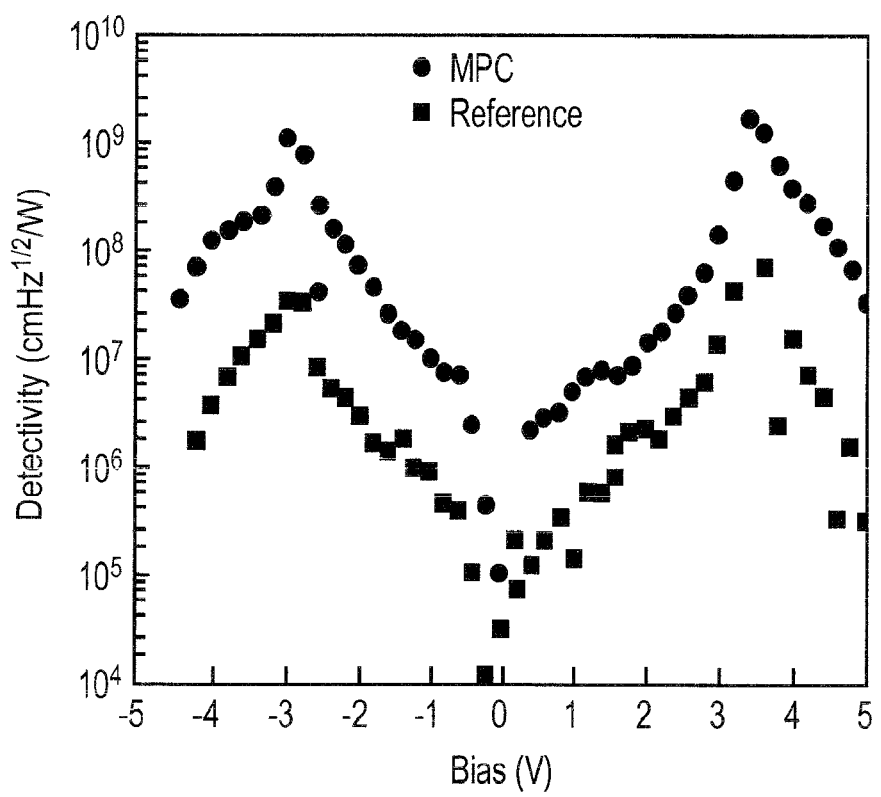
FIG. 3C shows the detectivity of the exemplary 3.6 μm-period MPC and the reference device at 10K.

FIGS. 3B and 3C are the plots of the responsivity and detectivity of the two devices versus bias. They were measured by an 800 K black body source with 800 Hz frequency chopping and the noise signal from a 293 K background with f/1 optics. As seen in FIG. 3C, each device has a maximum detectivity at −3.0 V and 3.4 V, referred to as the peak voltages, $V_p$'s. In FIGS. 3B and 3C, the responsivity and detectivity of the reference device are slightly asymmetric with respect to zero bias. They are 0.014 and 0.016 A/W and $1.5 \times 10^8$ and $3.7 \times 10^8$ cmHz$^{1/2}$/W at reverse and forward $V_p$, respectively. On the other hand, these parameters are larger by over an order of magnitude for the MPC device. Also, this device has a slightly asymmetric dependence on bias, as observed in FIGS. 3B and 3C. The responsivities of the MPC device at reverse and forward $V_p$ correspond to 0.23 and 0.1 A/W. The highest detectivities of the MPC device are $4.4 \times 10^9$ and $7.2 \times 10^9$ cmHz$^{1/2}$/W for reverse and forward $V_p$ respectively. For these biases, the detectivity ratios of the MPC to the reference device are 29 (reverse $V_p$) and 19 (forward $V_p$). For a bias higher than the turn-on voltage ~±2 V, the detectivity ratio roughly ranges from 20 to 30. The slight asymmetric I-V of FIG. 2A which is partly due to the 3-dimensional shape of the QDs is reflected on the responsivity and as a result the lower detectivity ratio (=19) of the MPC device for forward bias. The measured data are summarized in Table I.

Figure 2B:
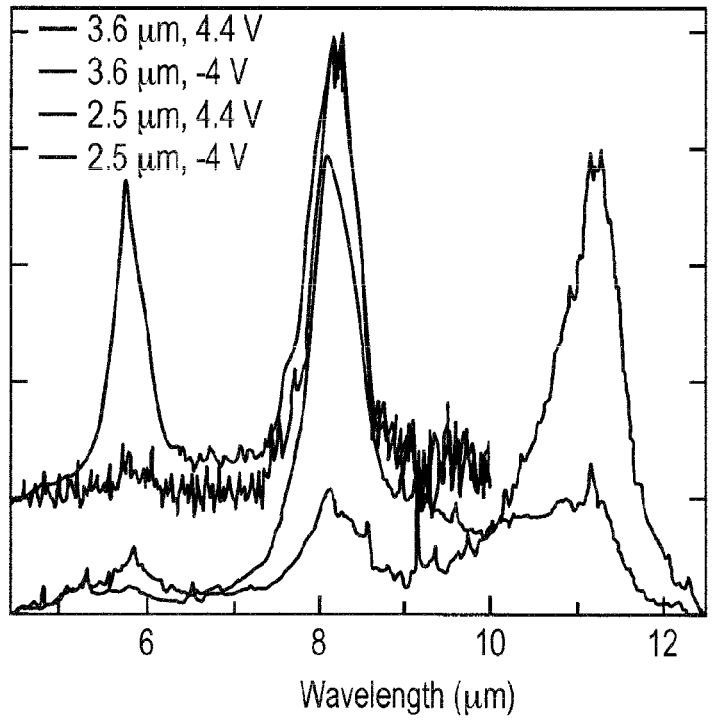
FIG. 2B shows spectral response curves of the exemplary 3.6 and 2.5 μm-period MPC devices for −4.0 V and 4.4 V at 10 K. Each spectrum was normalized by its highest peak intensity. Note that the spectra of the shorter period MPC device are offset for clarity.
Figure 4A:
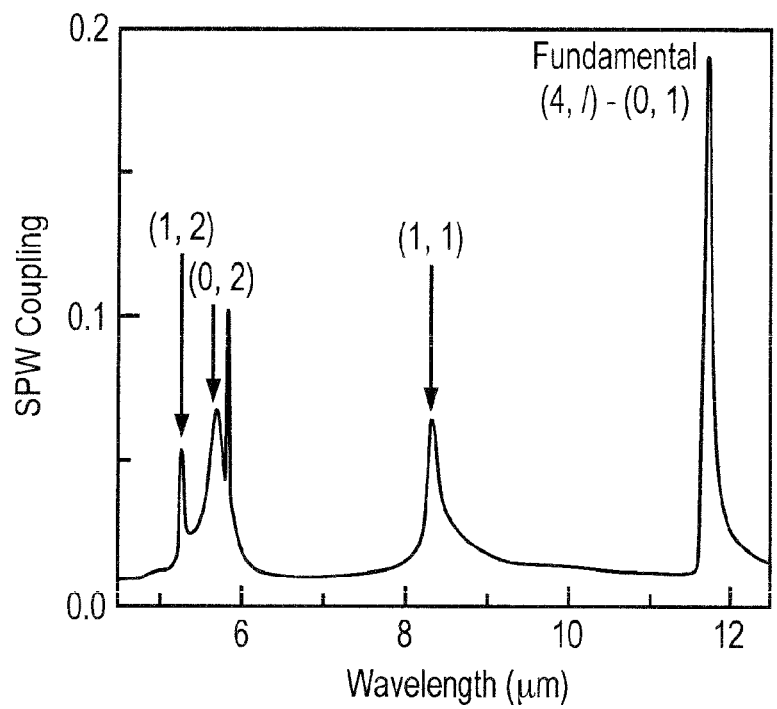
FIG. 4A shows SPW coupling (=1−R−T with reflection, R, and transmission, T) spectrum from RCWA simulation for the exemplary MPC herein.

The resonance wavelengths of Eq. (1) are identified in the normal-incidence spectral absorption modeling (1−R−T) where R and T are reflection and transmission respectively, calculated by rigorous coupled wave analysis (RCWA), as shown in FIG. 4A. The resonance wavelengths are 11.7, 8.3, 5.7, 5.3 μm for $\lambda_{01}$, $\lambda_{11}$, $\lambda_{02}$, and $\lambda_{12}$, respectively. Both calculated and measured $\lambda_{ij}$'s are summarized in Table I. Together with the spectral response from the MPC device examined earlier, FIG. 2B presents the responses for the two bias polarities from the same type QDIP but integrated with an MPC having a shorter period of 2.5 μm. The resulting device consistently has a similar enhanced performance. Because of the shorter period, the resonance wavelengths calculated from RCWA shift to lot $\lambda_{01}$=8.3 and $\lambda_{11}$=5.6 μm. As seen in FIG. 2B, the measurements from this device coincide with these calculated wavelengths and support the peak identifications shown in FIG. 4A.

Figure 4B:
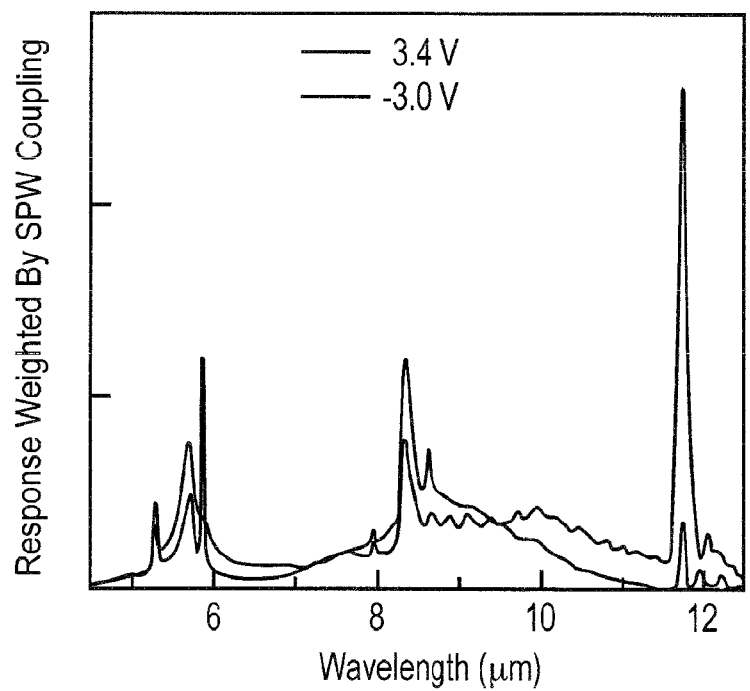
FIG. 4B shows spectral response curves of the reference device in FIG. 2A weighted by the SPW coupling from RCWA simulation in FIG. 4A.

If the enhancement of the photoresponse of the MPC device shown in FIG. 2A is caused by the coupling of the incident radiation to SPWs that are absorbed in the QDIP region, the strength of the evanescent field associated with the SP modes at the MPC/detector interface should be correlated to the enhanced detectivity. Then, the photoresponse of the MPC device coupled to this field can be estimated from that of the reference device weighted by the absorption in FIG. 4A. The results of this evaluation are shown in FIG. 4B. Of course, the actual measurement is taken at a range of incident angles corresponding to ~f/4, and the variation in the angle of incidence will broaden the response from the narrow peaks calculated for normal incidence. As mentioned, the peak shift in the photoresponse of a QDIP with bias polarity has been explained by QCS effect. However, the resonance wavelengths of the SP modes excited at MPC/detector interface are not affected by the bias. This is consistent with FIG. 2A and Table I; the resonance wavelengths are independent of bias polarity. On the contrary, the original photoresponse of a QDIP does vary with bias polarity because of the QCS effect, explaining the different coupling strength at the same $\lambda_{ij}$ as the polarity of the bias is changed. The absorption-weighted photoresponse of the reference device shown in FIG. 4B reveals peak intensities consistent with the experimental

TABLE I

Summary of measurement and modeling.

| | | $\lambda_{01}$ (μm) | $\lambda_{11}$ (μm) | $\lambda_{02}$ (μm) | $\lambda_{12}$ (μm) | Responsivity (A/W) | Detectivity $\times 10^9$ cmHz$^{1/2}$/W |
|---|---|---|---|---|---|---|---|
| Experiment | MPC −3.0 V | 11.3 | 8.1 | 5.8 | 5.4 | 0.23 | 4.4 |
| | Reference −3.0 V | Highest at 9.9 μm | | | | 0.014 | 0.15 |
| | MPC 3.4 V | 11.3 | 8.1 | 5.8 | 5.4 | 0.18 | 7.2 |
| | Reference 3.4 V | Highest at 9.2 μm | | | | 0.016 | 0.37 |
| Theory | Resonance wavelength (μm) | 11.7 | 8.3 | 5.7 | 5.3 | | |
| | Propagation length at $\lambda_{ij}$ (μm) without QD absorption | 1470 | 740 | 380 | 330 | | |
| | with 2% QD absorption | | 27.5 ± 0.5 | | | | |
| | With 10% QD absorption | | 5.1 | | | | |
| | Transverse penetration depth at $\lambda_{ij}$ (μm) | 14.1 | 7.2 | 3.7 | 3.2 | | | results shown in FIG. 2A. Except for line broadening, the theoretical photoresponse agrees with the experimental data in both resonance wavelength and corresponding relative intensity for given biases, as seen in FIGS. 2A, 4B, and Table I.

Figure 4C:
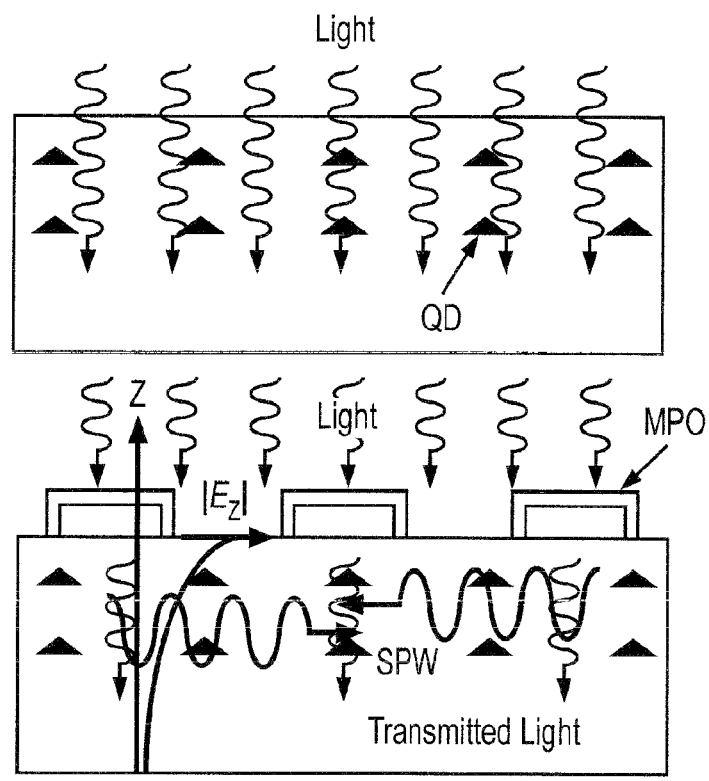
FIG. 4C shows a schematic illustration for the model proposed in this work (not scaled). The top illustration is the cross section view of a QDIP with no MPC and the bottom is that of the same QDIP with an MPC. Each detector has two QD stacks for convenience.

As summarized in Table I, both responsivity and detectivity can be dramatically enhanced by the integration of an MPC on a QDIP. The physics leading to this observation is schematically illustrated in FIG. 4C. SPWs are bound to the MPC/detector interface and propagate along it with a propagation length, $L_{sp}$, and with an electric-field polarization component normal to the interface (the $E_z$ of the evanescent field associated with the SPW in FIG. 4C). This polarization has a higher cross section for interaction with a QD than that the orthogonal, parallel polarization. In contrast, for the reference device, incident photons propagate normal to the QD stacks and across only the 1.2 μm-thick absorption region of FIG. 1C with a polarization parallel to the interface. As illustrated in FIG. 4C, the apparent cross section of the interaction of a single QD with incident photons is effectively increased by the finite propagating distance and $E_z$ component of the SPWs, and such QD-SPW coupling leads to the enhanced absorption in the MPC device.

The propagation length, $L_{sp}$, and transverse penetration depth into the detector of the evanescent field associated with SPWs, $\delta_{sp}$, including the effects of loss in the QDIP material, are derived from Eq. 1 and are given as $$L_{sp} \sim \frac{\lambda}{\pi} \frac{1}{\frac{\varepsilon_d''}{\varepsilon_d'}\left(1 - \frac{\varepsilon_d'}{\varepsilon_m'}\right) + \frac{\varepsilon_m'' \varepsilon_d'}{(\varepsilon_m')^2}} \quad (2)$$

and $$\delta_{sp} \sim \frac{\lambda}{2\pi} \sqrt{\frac{\varepsilon_m' + \varepsilon_d'}{-\varepsilon_d'^2}}$$

Figure 4D:
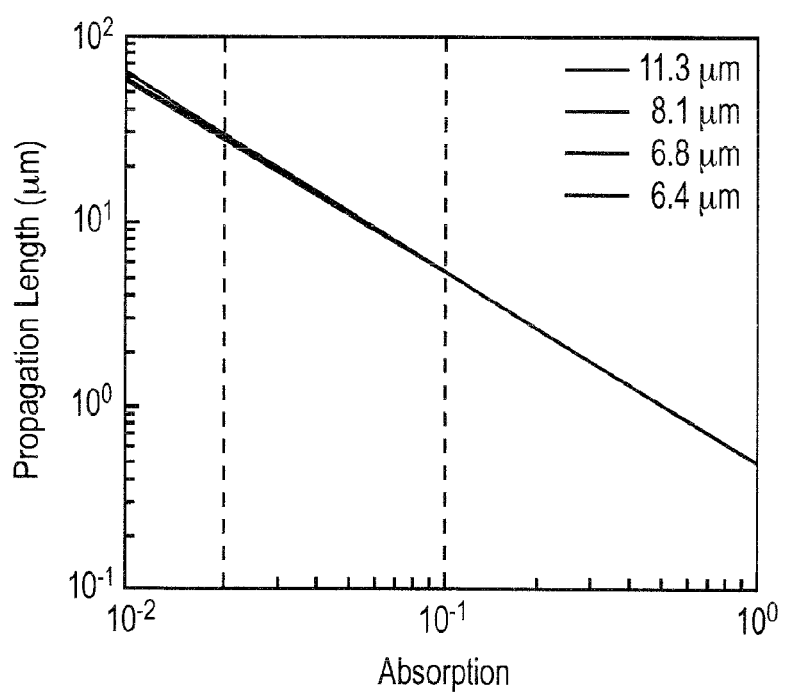
FIG. 4D shows propagation length ($L_{sp}$) as a function of the QD absorption. The four wavelengths in this plot correspond to the SPW resonance wavelengths in Table I. Two vertical dashed lines indicate the measured ~2% (left) absorption and 10% absorption (right for 5× increase) taking into account the increased cross section for TM polarization at normal incidence.

Here, $|\varepsilon_m'| \gg \varepsilon_d'$ was assumed. Then, as seen in Eq. (2), $\delta_{sp}$ is not influenced by $\varepsilon_d''$ but $L_{sp}$ changes with it. FIG. 4D presents the $L_{sp}$ of Eq. (2), estimated for an unpatterned gold/QDIP interface at the wavelengths of interest in this work, as a function of the absorption by the QD stacks beneath the interface which results in the a finite $\varepsilon_d''$. In FIG. 4D, $L_{sp}$ decreases with increasing absorption by the QD stacks. The unprocessed QDIP material has approximately 2% absorption around a wavelength of 10 μm for normal incidence irradiation. The $L_{sp}$'s and $\delta_{sp}$'s at all $\lambda_{ij}$'s calculated from Eq. (2) under these conditions are summarized in Table I. While $\varepsilon_{sp}$ depends approximately inversely on $\lambda_{ij}$, $L_{sp}$ is only weakly dependent on the resonance wavelength. For all of the wavelengths of interest, $\delta_{sp}$ in Table I is larger than the ~1 μm-thick absorption region, so that the SPWs effectively interact with the entire thickness of the QD stacks shown in FIG. 1C. In FIG. 4D and Table I, $L_{sp}$ is dominated by the QDIP absorption and is much shorter than it would be for a lossless dielectric, but is still considerably greater than the thickness of the absorption region for the wavelength range examined. The longer propagation distance across the in-plane extent of the device provides an enhanced absorption and, hence, detectivity. The cross section is increased for the $E_z$ polarization component of the SPW, perpendicular to the interface. For an estimate of ~5× enhanced interaction strength of the QDs with the TM-polarized SPWs² results in an estimate of $L_{sp}$~5-30 μm along the MPC/detector interface and explains the dramatic enhancement of the QDIP performance with the integration of an MPC. The actual change of the absorption depending on polarization varies with the details of the QD structure.

The RCWA simulation provides the SPW coupling for an ideal MPC structure. A small variation of parameters such as the diameter and precise shape of each hole generates relatively weak, multiple absorption peaks associated in particular with the higher energy resonances, for wavelengths shorter than $\lambda_{11}$. These could be the coupling to localized SPWs, associated with individual holes. A good example of such a feature is the sharp spike on the right of the SPW mode at $\lambda_{12}$ in FIG. 4A which is absent in the measurement of FIG. 2A.

As seen in FIGS. 2A and 2B, the bias-dependent spectral responsivity produces a dramatic change in the photoresponse of the MPC device when it is combined with the SPW resonance wavelengths. In the 2.5 μm-period device of FIG. 2B, the photoresponse at $\lambda_{01}$ is dominant for forward bias and comparable to that at $\lambda_{11}$ for reverse bias, unlike the 3.6 μm-period MPC device, but this can also be explained by the same mechanism based on the interaction of SPWs with QCS effect. In reverse bias, the device functions as a narrow band (<1 μm), two-color photodetector with a clear extension of working wavelength to ~5 μm along the reduction of the MPC period to 2.5 μm on the same QDIP. Depending on the period of an MPC, therefore, multi-color detection over the wide wavelength span is available by the integration of the MPC on a QDIP. Clearly, additional structure on an MPC will provide a great deal of flexibility in designing the device spectral response.

Generally, a dots-in-a-well photodetector shown in FIG. 1 provides multiple color response since there are multiple absorption mechanisms: intersubband within a dot, dot-to-well and dot-to-continuum. In addition, the QCS effect provides tunability within these bands. An MPC-integrated QDIP introduces yet another adjustable, and polarization-dependent, spectral selection mechanism. The interaction between the SPW coupling resonances and the QCS tuning allows various spectral responses on a given detector. By choosing the spatial period to locate the two lowest order SP resonance wavelengths at opposite sides of the photoresponse peak, for example, by designing the resonance wavelength of the fundamental SPW ($\lambda_{01}$) to be longer than, and that of the first higher order SPW ($\lambda_{11}$) to be shorter than the peak wavelength of a QDIP, as seen in FIG. 2A, an MPC can provide widely tunable functionality to a QDIP with a switch for color selection by the QCS effect. Additional flexibility is possible with multiple array periods (Moire patterns), and by adjusting the shapes of the individual features (for example slits rather than the simple holes in this embodiment) offering the possibility of fully customizable wavelength and polarization response.

Approximately, a thirty-fold enhancement of detectivity has been demonstrated in an InAs QDIP by the integration of an MPC. A 100 nm-thick gold MPC perforated with a 3.6 μm-period square array of circular holes couples to SP modes at 11.3 and 8.1 μm where the MPC-integrated QDIP exhibits the strongest peak for reverse and forward bias respectively with significantly enhanced photoresponse. SPWs propagate along the MPC/detector interface parallel to the QD stacks, with an evanescent field polarization component normal to the interface. Propagating SPWs increase the effective absorption cross section of an individual QD. Furthermore, the absorption cross section of the QD is larger for the SPW polarization component normal to the interface. Such QD-SPW coupling contributes to the photocurrent providing a significantly enhanced detectivity and ultimately leads to a high performance QDIP with an entirely different spectral response from a bare device.

As suggested above, individual detectors can employ various designs while utilizing the integration of the MPC on a QDIP. For example, an MPC-integrated quantum dot infrared photodetector (QDIP) can be backside illuminated from the substrate to the MPC of the same photodetector with more than 100% enhancement in detectivity compared to front-side illumination. This is explained with the absorption of incident light by the excitation of surface plasma waves at the MPC/QDIP interface that depends on light direction in the optically asymmetric air/MPC/QCIP structure. Such a structure has the identical transmission for both light directions but different absorption leading to higher photoresponse for back-side illumination. In backslide illumination, the MPC-integrated QDIP exhibits almost 100 times enhanced detectivity compared with a bare QDIP. This is considerably higher than the 20-fold increase as the front side illumination on the same detectors.

Figure 5A:
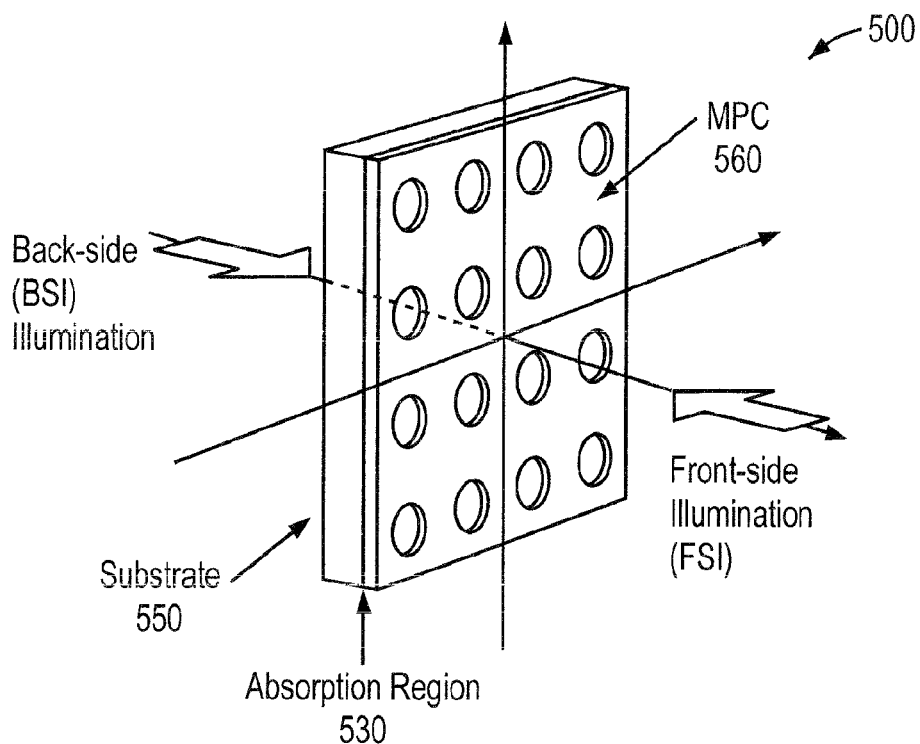
FIG. 5A shows a schematic illustration of an MPC integrated on a photodetector with light incident directions shown.

FIG. 5A illustrates an MPC-integrated device 500, in which an MPC 560 is integrated on a photodetector having an absorption region 530 and a substrate 550, corresponding to that structure described in connection with FIG. 1. The light incident directions are depicted by arrows according to exemplary embodiments herein. It should be readily apparent to one of ordinary skill in the art that the exemplary MPC-integrated device 500 depicted in FIG. 5A represents a generalized schematic illustration and that other components can be added or existing components can be removed or modified.

In the MPC-integrated device 500, when light is incident from a medium to another medium through the MPC 560, SPW's are excited on both sides with the wavelengths, depending on the dielectric properties of the media and the period of the array in the MPC 560. Generally, as shown in FIG. 5A, the MPC 560 has been integrated on a photodetector to use the SPW excited at the MPC/detector interface on the opposite side from the light source. In this case, referred to as front-side illumination (FSI), the absorption of light by the MPC, $A_f$, correlated to the strength of the coupling of SPW to the absorption region is given as $$A_f = 1 - T_f - R_f \quad (3)$$

where $T_f$ and $R_f$ are transmission and reflection for FSI respectively. While $A_f$ depends on the design of an MPC, an upper limit of ~0.2 has been observed experimentally. A compromise is necessary between the transmission through the MPC and the coupling to the SPW, which limits this value. Even with this level of absorption, up to 30-fold enhancement of detectivity has been reported with an InAs quantum dot infrared detector (QDIP).

When the light is incident in the reverse direction indicated in FIG. 5A, the MPC/detector interface for the direct coupling of the detector absorption region to SPWs is at the same side as the light source. In such an optically asymmetric structure, however, the transmission in Eq. (3) is invariant regardless of light direction. In this case, referred to as back-side illumination (BSI), the absorption of the incident light by the MPC, $A_b$, is then satisfies the relation given as $$A_b = A_f + (R_f - R_b), \quad (4)$$

where $R_b$ is the reflection at BSI. Since $R_f \ne R_b$ in FIG. 5A, $A_b \ne A_f$. Thus, the light absorption by the MPC correlated with the SPW excitation at MPC/detector interface is dependent on light incident direction. Because no transmission through the MPC is required, the coupling into SPWs can be larger in this case.

Figure 5B:
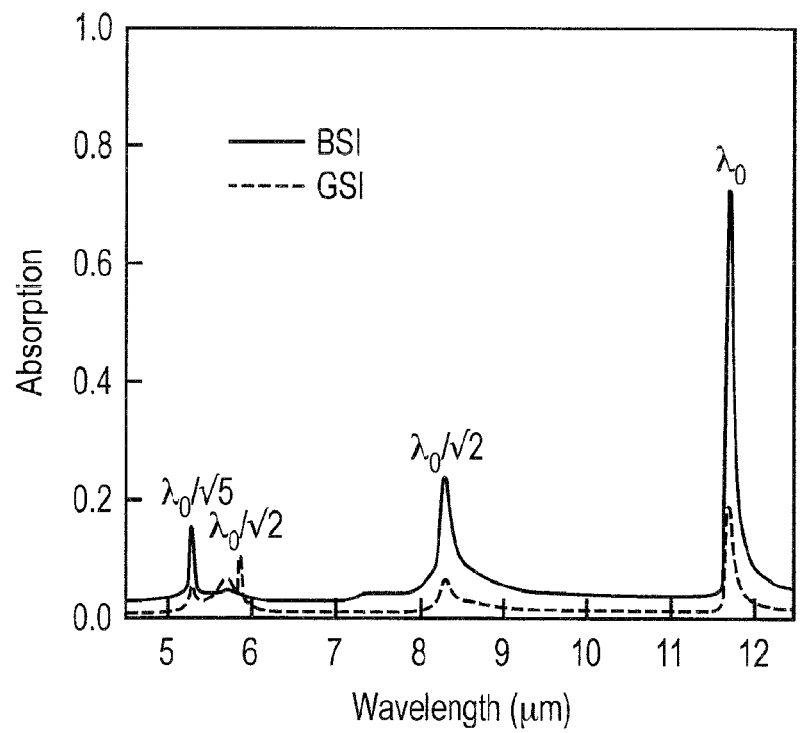
FIG. 5B shows absorption spectra obtained from an MPC integrated on a GaAs substrate for back and front side illumination.

FIG. 5B is the absorption spectra of an MPC for FSI and BSI in FIG. 5A, calculated from rigorous continuous wave approximation (RCWA). The MPC used in this simulation is a 100-nm thick gold film of which the period, p, and diameter of a hole array are 3.6 μm and 1.75 μm respectively. The dielectric constant of a GaAs substrate, n, was considered to vary along wavelength at low temperatures and that of Au was obtained from Drude model. In FIG. 5B, multiple absorption peaks due to SPW resonances at $\lambda_0$=np~11.7 μm, $\lambda_0/\sqrt{2}$~8.3 μm, $\lambda_0/2$~5.8 μm, and $\lambda_0/\sqrt{5}$~5.4 μm on the MPC/GaAs interface are observed. As seen in this figure, because of the difference of dielectric properties between air and GaAs, $A_b$ for BSI becomes considerably greater than $A_f$ for FSI. The highest $A_b$ is 0.72 at 11.7 μm, approximately 3.8 times the maximum $A_f$=0.19 at the same wavelength. Thus, the light absorption by the SPW excitation in an MPC is crucially affected by light incident direction in the given optically asymmetric structure.

Figure 6:
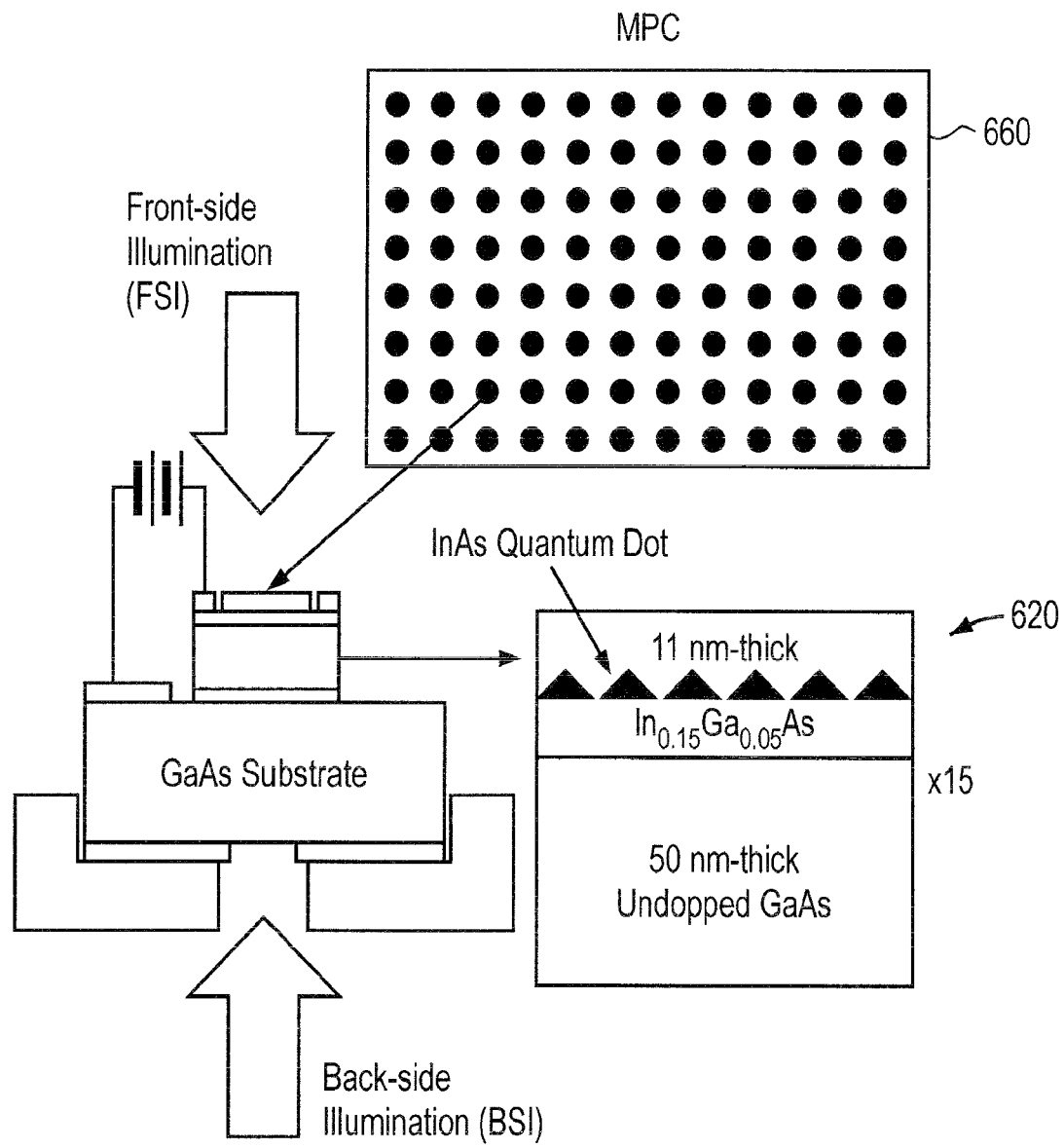
FIG. 6 is a cross-sectional view of an MPC-integrated QDIP according to exemplary embodiments.

If the light absorption by an MPC is significantly increased by the change of light direction from front- to back-side illumination, it must be reflected on the performance of a photodetector through its enhanced photoresponse. To examine this effect, an InAs QDIP was employed. The QDIP was grown on a semi-insulating GaAs(001) substrate by molecular beam epitaxy. The dot density was $3.0 \times 10^{11}$ cm$^{-2}$. It was processed into a 410×410 μm$^2$ mesa with a 300 μm-diameter aperture. Its detailed layer structure is summarized in FIG. 6. As shown in FIG. 6, the MPC 660 is integrated atop a QDIP 620 in which an absorption region consists of 15 stacks of InAs quantum dots (QD) buried in undoped In$_{0.15}$Ga$_{0.85}$As quantum well (QW) layers.

An MPC 660 identical to that used in the RCWA calculation (and as described above) was fabricated on the QDIP 620. Its scanning electron microscope (SEM) image is also shown at the top of the same figure. For BSI, the backside of the substrate was polished and covered with an Au film. As illustrated in FIG. 6, an aperture of the same diameter as that on the mesa was processed on the polished surface so that both illuminations can deliver equal light power to the absorption region of the MPC-integrated QDIP (MPC detector).

Figure 7A:
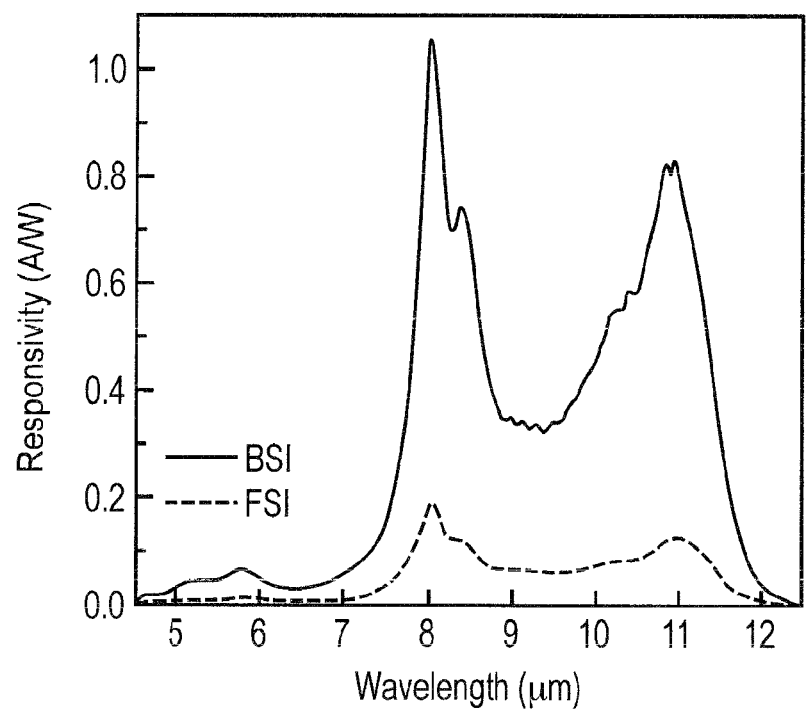
FIG. 7A is a plot of wavelength versus responsivity of the MPC detector for back side illumination (BSI) and front side illumination (FSI) at 3.4V.
Figure 7B:
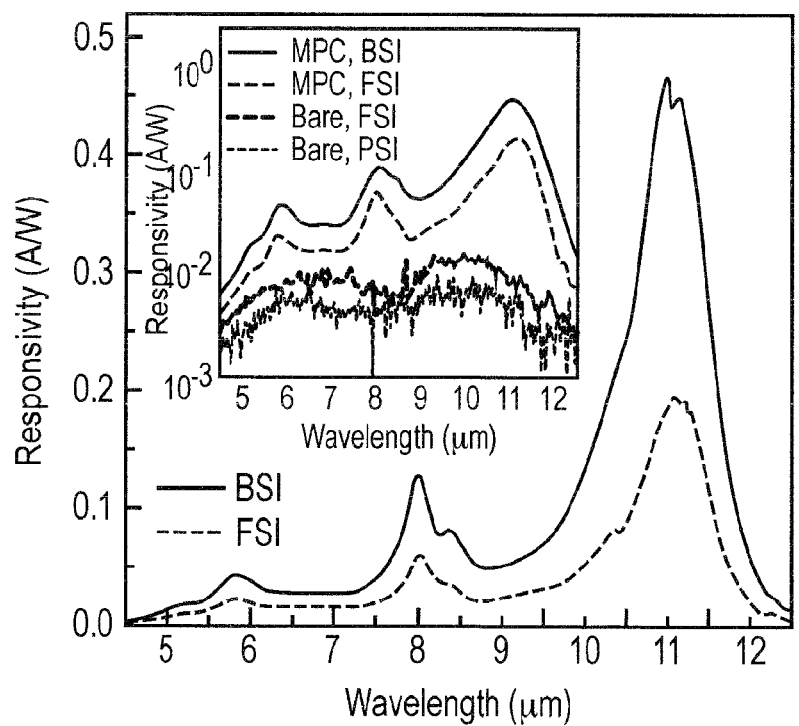
FIG. 7B is a plot of wavelength versus responsivity of the MPC detector for back side illumination (BSI) and front side illumination (FSI) at −2.8V. The inset includes the responsivity of a bare detector at the same bias.

FIGS. 7A and 7B show the spectral response of the MPC-detector for FSI and BSI at 3.4 V and −2.8 V, respectively. In each figure, the line shape for both illuminations is almost the same except for intensity. The peaks in every spectrum of FIG. 7A can be identified along with the peaks indicated in FIG. 7B. The inset of FIG. 7B reveals the effect of MPC integration on a QDIP from the comparison with a QDIP having the identical structure shown in FIG. 6 but with no MPC (bare detector). The bare QDIP in the inset has the peak response at 9.9 μm at the given reverse bias. It should be noted that the responsivity, R, of the bare detector for BSI is only ~50% of that of the same detector for FSI by Fresnel reflection at the air/substrate interface. Owing to quantum confinement Stark effect, the dominant peak of the bare detector in the inset shifts to 9.2 μm for forward bias (not shown). Such a polarity dependent peak shift results in different response intensity for forward and reverse bias in the MPC detector, which has the strongest peak at 8.1 μm for forward (FIG. 7A) and 11.0 μm at reverse (FIG. 7B) bias corresponding to $\lambda_0/\sqrt{2}$ and $\lambda_0$ of SPW resonance in FIG. 5B respectively. Furthermore, R of the MPC detector is higher than that of the bare detector at least by an order of magnitude for both side illuminations. The overall response curves of the MPC detector in FIG. 6 are therefore very different from those of the bare QDIP in both peak position and intensity, and are rather similar to those in FIG. 5B. For 3.4 (−2.8) V in FIG. 5A (FIG. 5B), R is increased from 0.46 (0.19) to 1.020 (0.356) A/W at 8.1 µm (11.0 µm), corresponding to ~100% increase by changing the light direction from FSI to BSI. In BSI, as mentioned earlier, approximately 40% of incident light is lost before it reaches the absorption region of the QDIP by Fresnel reflection at air/substrate interface. This is not included in the RCWA results in FIG. 5B. In consideration of the Fresnel reflection, the effective R for BSI becomes roughly 3.3 times that for FSI. This is consistent with the simulation result shown in FIG. 5B which predicts 3.8 times enhancement from the absorption spectra. Experimentally, FIGS. 5 and 7 clearly provide important evidence that the enhancement of photoresponse in an MPC-integrated photodetector is directly correlated with the light absorption by an MPC and thus with the coupling of SPWs excited at MPC/detector interface by incident light to the absorption region of a photodetector. Therefore, the incident direction of light is very important in the response enhancement of a photodetector with the integration of an MPC.

Figure 8A:
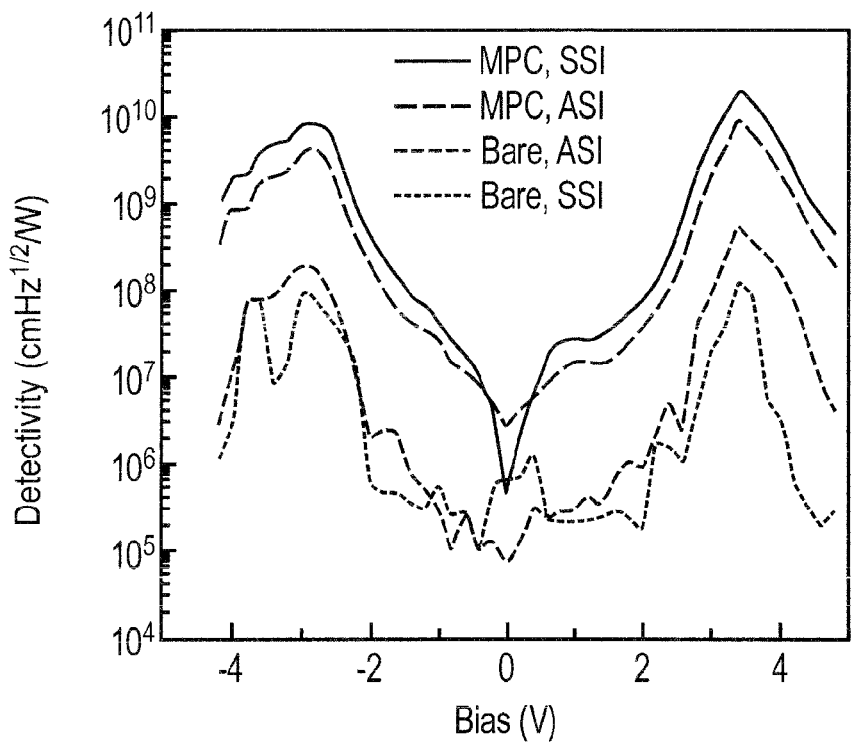
FIG. 8A is a plot of bias versus detectivity, D*, of the MPC-detector for both FSI and BSI.
Figure 8B:
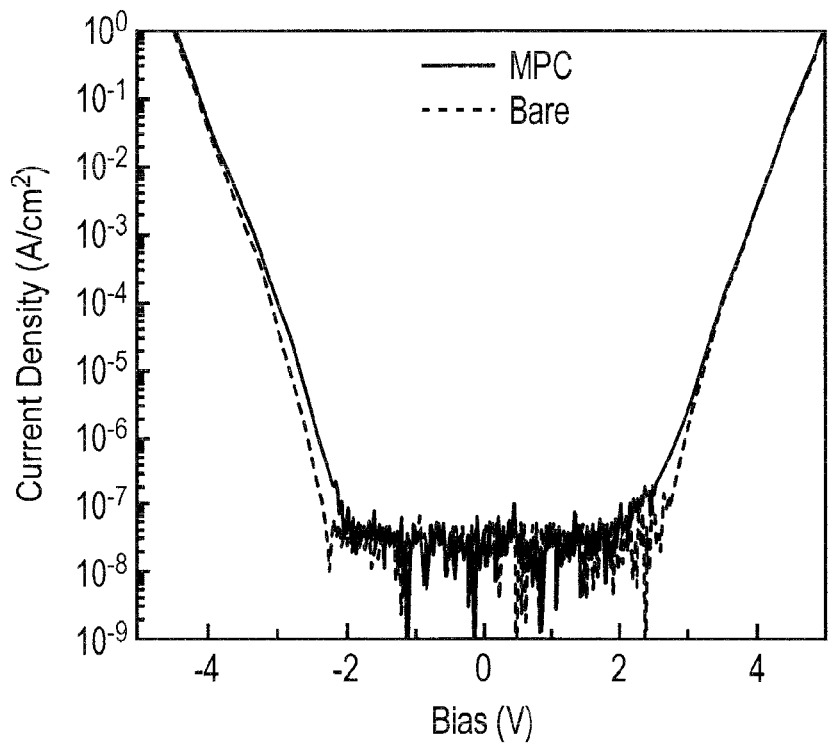
FIG. 8B is a plot showing I-V curves of both MPC and bare detectors.

FIG. 8A is a plot of bias versus detectivity, $D^*$, of the MPC-detector for both FSI and BSI. As seen in this figure, $D^*$ has the peak values near 3.4 and −2.8V. The highest $D^*$ for BSI is $2.1 \times 10^{10}$ and $8.5 \times 10^9$ cmHz$^{1/2}$/W at 3.4 and at −2.8V respectively while that for FSI is $9.5 \times 10^9$ and $4.6 \times 10^9$ cmHz$^{1/2}$/W at the given biases. Then, $D^*$ is likewise ~20-fold enhanced by changing light direction. FIG. 8B shows I-V curves of both MPC and bare detectors. Their I-V characteristics are very similar to each other except for the bias around turn-on voltage ~+2.5 V. At 3.4V, for example, the current densities of the MPC and the bare detector are 6.0× and $5.0 \times 10^{-5}$ A/cm$^2$, respectively.

Finally, $D^*$ of the MPC-detector is compared with that of the bare QDIP. As seen in FIG. 8, $D^*$ of both side illuminations of the MPC detector is significantly higher than that of the bare detector for FSI; ~20-fold enhancement in the MPC detector compared with the bare detector for FSI (i.e., 5.4× $10^8$ in the bare detector to $9.5 \times 10^9$ cmHz$^{1/2}$/W in the MPC detector at 3.4 V) and as a result ~100-fold enhancement in the MPC detector relative to the bare detector for BSI (i.e., from $9.9 \times 10^7$ cmHz$^{1/2}$/W at −3.0 V in the bare detector to $8.7 \times 10^9$ cmHz$^{1/2}$/W at −2.8 V in the MPC detector). Accordingly, $D^*$ is roughly enhanced by the order of two with the integration of a 3.6 µm-period gold MPC on the InAs QDIP in BSI. Further enhancement can be achieved with antireflection coating on the backside of a substrate (not shown).

Conclusively, the incident light direction to an MPC bounded by air and a photodetector crucially affects the coupling of the SPWs excited at MPC/detector interface to the absorption region of the detector. In both experiment and simulation, back-side illumination considerably increases the coupling strength compared with front-side illumination and results in approximately 100-fold enhancement in detectivity.

However, this arrangement, an MPC with air holes atop a substrate-side illuminated semiconductor QDIP detector, is not yet amenable to current manufacturing of focal plane arrays (FPAs) which typically involve indium bump bonding of the FPA to a silicon-based read-out integrated circuit (ROIC). This is because the bump bonding process would result in filling of the air holes with indium, a high optical loss metal that would result in absorption of the incident light in the indium regions and a poor overall quantum efficiency. A corrugated metal surface (CMS) where the air holes are replaced with metal posts with the same periodicity resolves this issue by decoupling the optical properties of the CMS/semiconductor interface from the indium bump processing and ROIC integration. The thickness of the metal film is chosen to be much greater than the skin depth of the incident radiation for this application. It is also possible to use dielectric structures in place of the metal structures for the CMS. The requirement is that the periodicity provide the necessary wavevectors for the coupling and that the interaction be sufficient for strong coupling. Detailed electromagnetic calculations are helpful in establishing the proper structure.

Figures 9A, 9B:
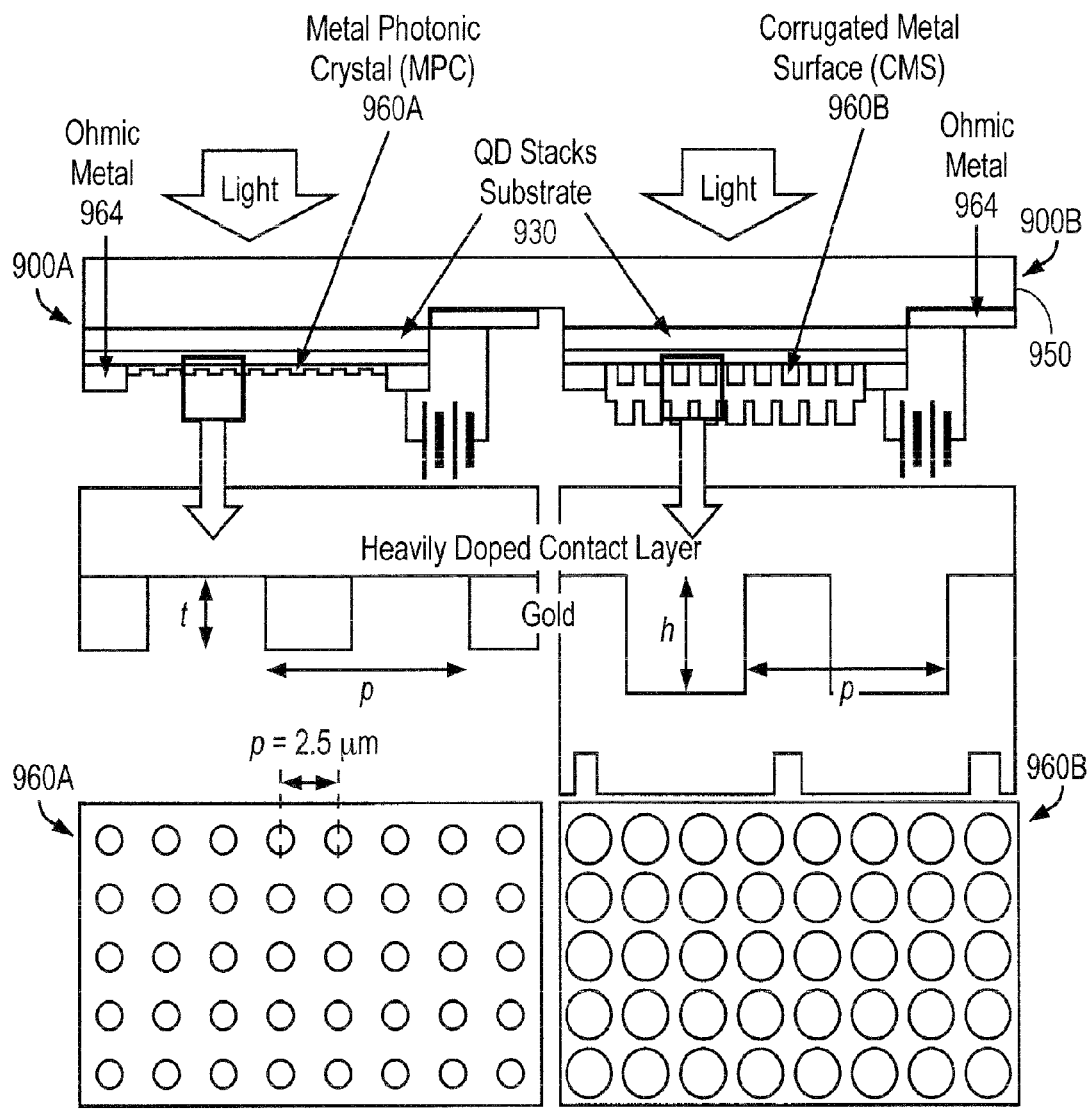
FIGS. 9A and 9B are cross sectional views of an MPC-integrated and CMS-processed QDIP, respectively.

FIG. 9A shows a schematic cross sectional diagram of an MPC-integrated QDIP 900A with the light in BSI. FIG. 9B shows a schematic cross sectional diagram of a QDIP 900B of which the top contact layer is processed with an array of posts of period, p, and height of surface corrugation or corrugation amplitude, h, that is passivated by a thick gold film which can be substituted for an indium bump. For each of FIGS. 9A and 9B, the illustration at the bottom of each figure is a top view of an SEM image 960A, 960B, respectively of each device. It should be readily apparent to one of ordinary skill in the art that the exemplary devices 900A, 900B depicted in FIGS. 9A and 9B represent generalized schematic illustrations and that other components can be added or existing components can be removed or modified.

In FIGS. 9A and 9B, the MPC 960A and CMS 960B are integrated atop a QDIP (not shown in detail) in which an absorption region 930 includes stacks of InAs quantum dots (QD) buried in undoped InGaAs quantum well (QW) layers and is formed over substrate 950.

The corrugated metal surface CMS 960B can be examined for the plasmonic enhancement of a photodetector applicable to focal plane arrays. A CMS 960B having of a 2.5 µm-period, 2-dimensional (2D) square array of circular posts passivated with a thick gold film can be fabricated on the heavily doped top GaAs contact layer of an InAs quantum dot infrared detector (QDIP). In back-side illumination, the CMS 960B has strong absorption with negligible transmission, and provides the enhancement of the QDIP with the direct coupling of the surface plasma waves excited at the CMS/QDIP interface to the absorption region of the detector that is comparable to a metal photonic crystal—a gold film perforated with the same period 2D array of holes. At 77K, the CMS-processed QDIP exhibits ~15-fold enhancement of detectivity compared with an original QDIP.

A plasmonic photodetector for focal plane arrays (FPAs) is disclosed. It has been reported that the back-side illumination (BSI) is more effective than the front-side illumination (FSI) on a metal photonic crystal (MPC) integrated on a quantum dot infrared photodetector (QDIP) in achieving photoresponse enhanced by the surface plasma waves (SPWs) excited at the MPC/QDIP interface. FIG. 9A shows a schematic cross sectional diagram of the MPC-integrated QDIP 900A with the light in BSI. As shown in FIG. 9A, MPC 960A is a metal film perforated with a 2-dimensional (2D) array of holes and is characterized by the period of holes, p, and the thickness of a metal film, t. Such enhancement depending on light direction can be applied to FPAs since they are inherently designed on BSI scheme. In this case, however, MPCs in BSI are not allowed because the top surface of every pixel of an FPA should contact an indium bump to have an electrical connection to a readout circuit. To accomplish the best SPW enhancement in the conventional FPA structures, a corrugated metal surface (CMS) is more suitable than an MPC. A CMS is a metal surface having a 2D surface corrugation for the excitation of SPWs by incident light.

FIG. 9B shows a schematic cross sectional diagram of a QDIP 900B of which the top contact layer is processed with an array of posts of period, p, and height of surface corrugation or corrugation amplitude, h, that is passivated by a thick gold film which can be substituted for an indium bump. Then, the CMS 960B in FIG. 9B is working only on the BSI scheme but has strong absorption with negligible transmission in normal incidence of light. In this given structure, the light incident to the QDIP 900B is directly coupled to the absorption region consisting of QD stacks by the SPWs excited at the CMS/QDIP interface, like those at the MPC/QDIP interface in FIG. 9A. In the following, a CMS processed QDIP is fabricated and compared with an MPC-integrated and a bare QDIP in simulation and experiment to examine its potential for better FPAs.

Figure 10:
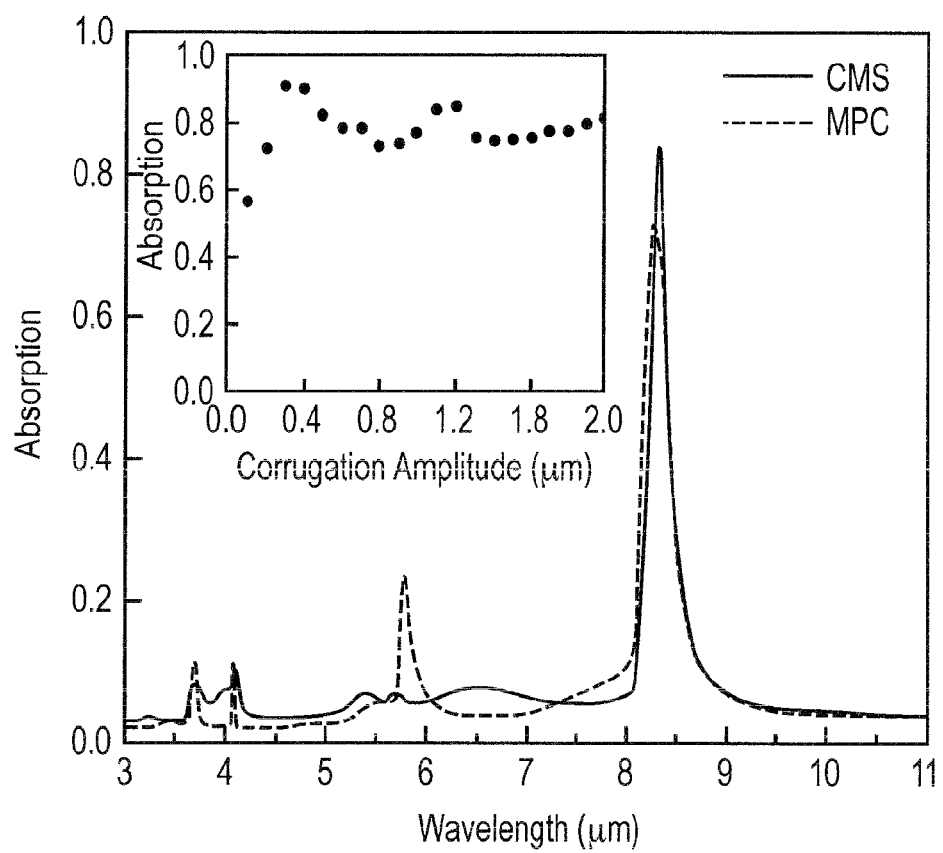
FIG. 10 is a plot of wavelength versus absorption of a gold CMS/GaAs and a gold MPC/GaAs structure calculated from RCWA.

FIG. 10 is the simulation results of the spectral absorption (=1−T−R, where T and R are transmission and reflection) of a gold CMS/GaAs and an air/gold MPG/GaAs structure that were calculated by rigorous continuous wave approximation (RCWA). Both of them have the same period of p=2.5 μm. On the other hand, the post height or corrugation amplitude h=1.1 μm in the CMS while t=0.1 μm in the MPC. The diameter of the post in the CMS is p/2, equal to that of the holes in the MPC. Light is assumed to propagate from GaAs to air through a gold MPC. On the contrary, it is incident through GaAs on the CMS prepared on gold. The wavelength dependence of the dielectric constant of GaAs and gold was considered by the reported data and Drude model.

In FIG. 10, absorption has a maximum strength near 8.3 μm in both CMS and MPC. This corresponds to the longest wavelength SPW resonance mode near $\lambda_0$=np available at the given CMS/GaAs and MPC/GaAs interface, where n is the refractive index of GaAs at $\lambda_0$. Other peaks in FIG. 10 are identified with the SPWs excited at $\lambda_0/\sqrt{2}$~5.9 μm, $\lambda_0/2$~4.2 μm, and $\lambda_0/\sqrt{5}$~3.7 μm. In CMS, h is one of the crucial parameters that affect absorption strength. The inset is h-dependence of the absorption at $\lambda_0$. Absorption rapidly increases with h, and has the highest value ~0.91 at h=0.3 μm and the second highest ~0.85 at 1.1 μm that was used for the spectrum calculation of the CMS/GaAs structure in FIG. 10. In the given MPC, as seen in the figure, the absorption at $\lambda_0$ is ~0.74. Thus, CMS is better than MPC in absorption strength. Although there is a little difference, both CMS and MPC have similar absorption spectra at the given structures. In RCWA, therefore, CMS and MPC are comparable to each other in SPW excitation, which is very promising in the application of plasmonic effects of CMS to FPAs.

The CMS and MPC employed in FIG. 10 were examined with their integration on a QDIP that was grown on a semi-insulating GaAs(001) substrate by molecular beam epitaxy. The absorption region of the QDIP consists of 30 stacks of InAs QDs of the dot-in-a-well structure of which the dot density is ~1×10$^{11}$/cm$^2$. The details of the QDIP structure similar to that used in this work were summarized above in connection with FIG. 1. One of the 1.3 m-thick top contact layer of the two identical QDIPs was etched down to 0.2 μm for an MPC and the other was fabricated into a 2.5 μm-period 2D square array of 1.1 μm-high, circular posts for a CMS. A 2.5 μm-period, 0.1 μm-thick gold MPC was fabricated on the former and a 2.2 μm-thick gold was deposited on the latter to completely cover the post array with gold for a CMS. FIGS. 9A and 9B show the scanning electron microscope (SEM) images taken from the devices 900A, 900B, respectively. The device size of the CMS and the MPC was set to 300 μm in diameter on a 410×410 μm$^2$ mesa. For BSI, an 800 μm-diameter aperture was fabricated on the polished backside surface of the substrate in each device. The photoresponse of a CMS-processed QDIP (CMS detector) and a MPC-integrated QDIP (MPC detector) was compared with that of an identical unprocessed QDIP (bare detector) at 77K.

Figure 11A:
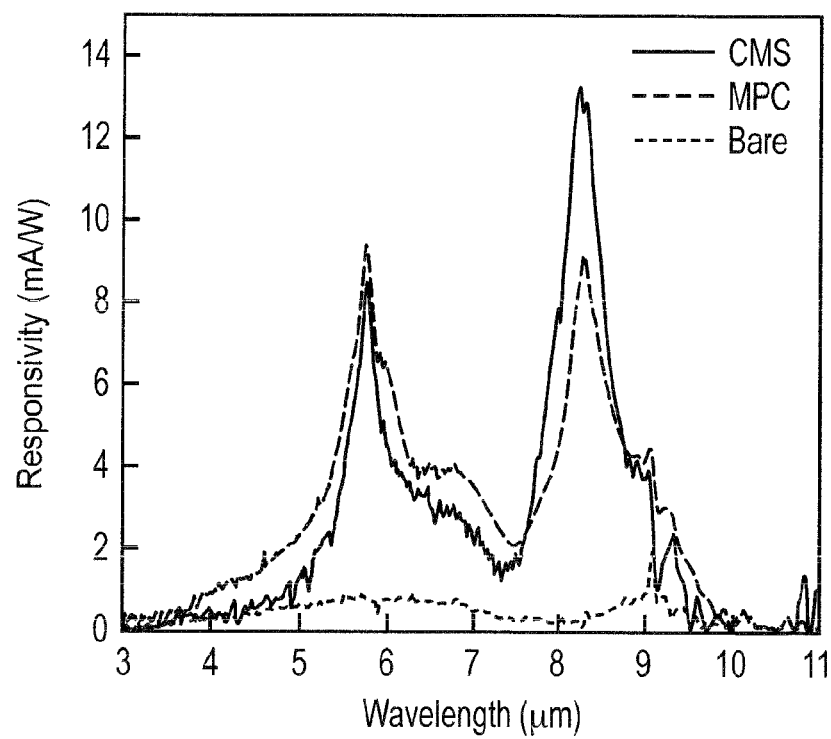
FIGS. 11A and 11B are spectral responsivity of three devices for −2.0V and 0.6V at 77K, respectively.
Figure 11B:
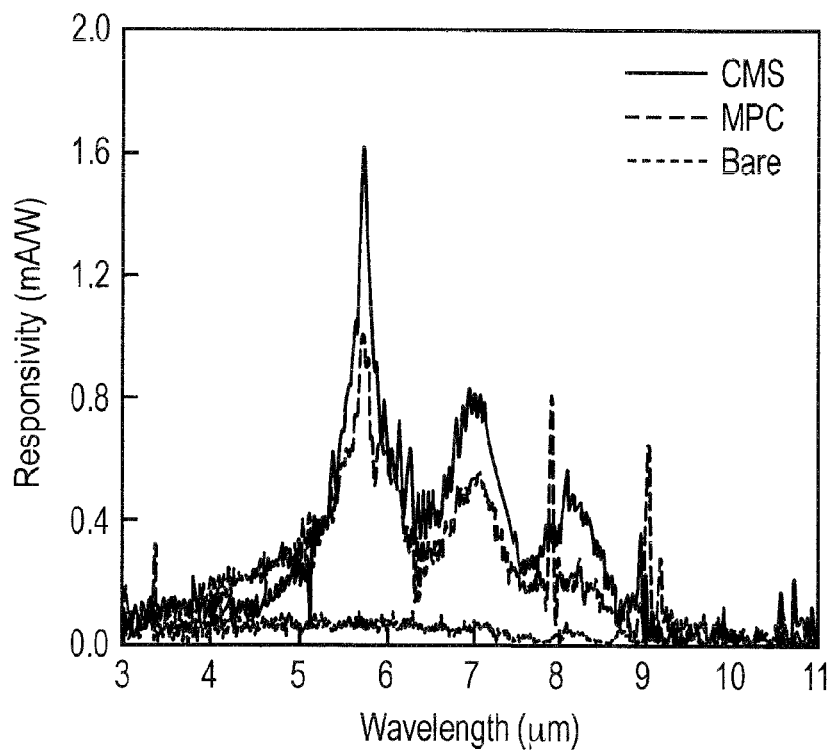

FIGS. 11A and 11B show the spectral responsivities of three devices at −2.0 V and 0.6 V, respectively. First of all, the CMS and the MPC detector have very different response curves from the bare detector in intensity as well as peak position; the bare detector has broad peaks at 9.2 and 5.8 μm for negative bias and 7.1 and 5.6 μm for positive bias. The peak identification and bias polarity dependence of a dot-in-a-well QDIP has been disclosed above. Unlike the bare detector, the CMS and the MPC detector have relatively narrow peaks at 8.3 and 5.8 μm for negative bias and 8.3, 7.1 and 5.8 μm for positive bias. The MPC detector has an additional peak at 4.2 μm. From the comparison with the absorption peaks in FIG. 10, it can be seen that the peaks at 8.3, 5.8, and 4.2 μm are very close to $\lambda_0$, $\lambda_0/\sqrt{2}$, and $\lambda_0/2$, implying that they correspond to the SPWs excited at the gold/GaAs interfaces by incident light. While a bump at 6.8 μm for −2.0 V is not clearly understood, another peak at 7.1 μm for 0.6 V is, as seen in FIG. 11B, correlated with the peak at the same wavelength of the bare detector.

In FIGS. 11A and 11B, the peak responsivities of the CMS and the MPC detector, $R_{CMS}$ and $R_{MPC}$, are significantly higher than that of the bare detector, $R_{bare}$, for both negative and positive bias; $R_{CMS}$~13 mA/W, $R_{MPC}$~9 mA/W, $R_{bare}$~0.6 mA/W at −2.0 V, and $R_{CMS}$~1.6 mA/W, $R_{MPC}$~1.0 mA/W, $R_{bare}$~0.07 mA/W at −0.6 V. Thus, $R_{CMS}$ is higher than $R_{MPC}$. This is consistent with the simulation in FIG. 10. Approximately, $R_{CMS}$ and $R_{MPC}$ are 15-20 times higher than $R_{bare}$ at the given biases. Such enhancement with the peak locations can be explained by the direct coupling of the SPWs excited at the gold/QDIP interface to the absorption region of each detector. In both CMS and MPC detector, the dominant peak is at 8.3 μm for −2.0 V while it occurs at 5.8 μm for 0.6 V. Such variation with bias in those devices is also correlated with the corresponding responsivity of the bare detector. In particular, the peak of the bare detector at 5.8 μm is exactly overlapped over $\lambda_0/\sqrt{2}$ calculated in FIG. 10. This leads to relatively high photoresponse at this wavelength for both negative and positive bias, and provides further evidence supporting the coupling effects generated by CMS and MPC.

Figure 12A:
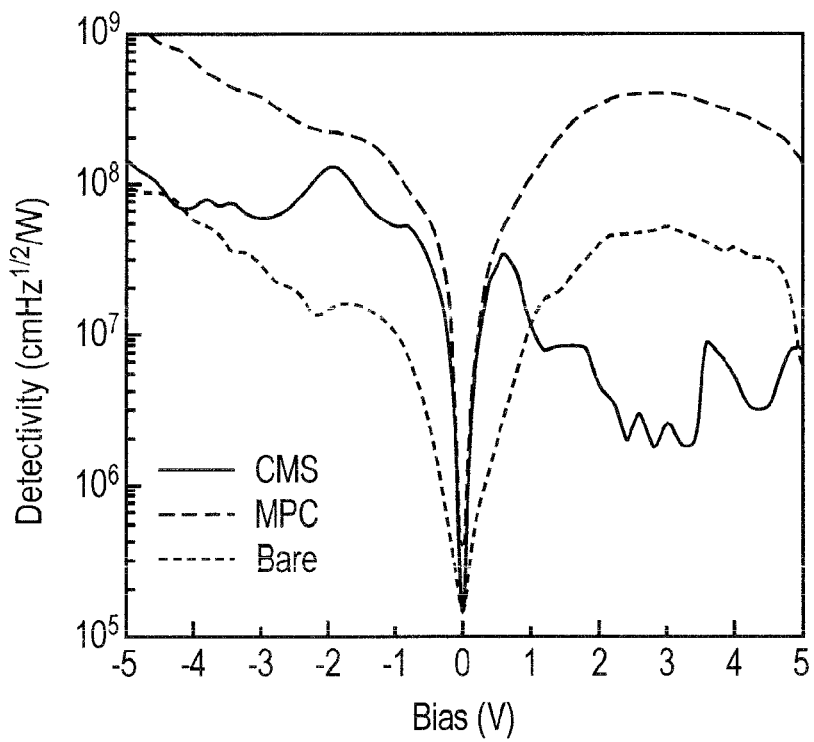
FIGS. 12A and 12B are a plot versus detectivity of three devices at 77K and a plot of I-V characteristics of three devices at 77K, respectively.

FIG. 12A presents a plot of bias versus detectivity, D*, of three devices. For the bias ranging −2.0 to 0.6 V, the detectivities of both CMS and MPC detector, $D_{CMS}^*$ and $D_{MPC}^*$, are considerably greater than that of the bare detector, $D_{bare}^*$. At −2.0 and 0.6 V, the CMS detector has the highest $D_{CMS}^*$~1.7×10$^8$ and 3.9×10$^7$ cmHz$^{1/2}$/W, respectively. At the same biases, $D_{MPC}^*$~2.4×10$^8$ and 5.0×10$^7$ cmHz$^{1/2}$/W whereas $D_{bare}^*$ is only about 1.2×10$^7$ and 2.6×10$^6$ cmHz$^{1/2}$/W. Thus, $D_{CMS}^*$ and $D_{MPC}^*$ show roughly 15- and 20-fold enhancement compared with $D_{bare}^*$ at the given biases, respectively. Likewise, the enhanced detectivity is due to the SPW coupling effects. Beyond the bias range mentioned above, $D_{CMS}^*$ decreases with increasing voltage, unlike other two devices.

Figure 12B:
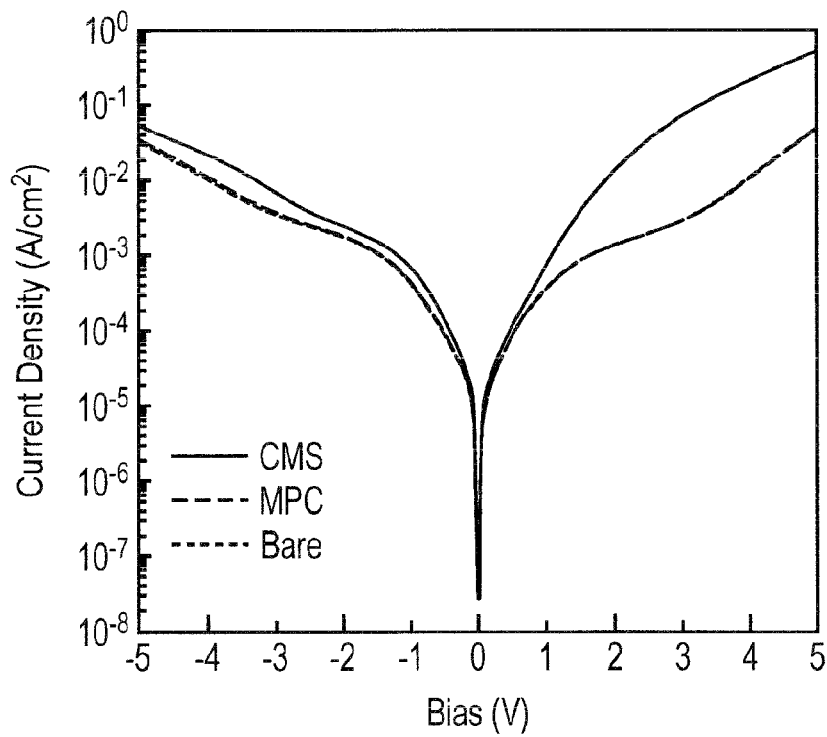

In FIGS. 11 and 12A, the CMS detector has better responsivity but lower detectivity than the MPC detector. The i-V characteristics of three devices in FIG. 12B serve a possible explanation for this behavior. The CMS detector has similar current level to other devices for the bias ranging −2.0 to 0.6 V but comes to have considerably high current beyond this interval especially in positive bias. It has been known that an Au/n-doped GaAs interface forms a Schottky junction which behaves as a conductor for positive bias indicated in FIGS. 9A and 9B. Accordingly, the gold/QDIP interface of the CMS or the MPC detector can play such a role at the same bias polarity. The CMS and the MPC shown in FIGS. 9A and 9B were processed so that they were electrically connected to the top ohmic metal of each device.

FIGS. 11 and 12 confirm that the CMS detector keeps SPW coupling effects comparable with the MPC detector in BSI at the bias range described above. Most reported articles on the plasmonic enhancement of photodetectors have focused on the application of MPCs in FSI mentioned earlier. However, at most 10-fold enhancement is expected from the MPC detector in FSI. The insertion of a thin dielectric film between a metal film and a doped top contact layer in the CMS detector can resolve the issue on the electrical degradation of a metal/semiconductor interface and, as predicted in FIG. 10, induce the detectivity better than the MPC detector reported in this work. For higher plasmonic enhancement in FPA, therefore, CMSs available in BSI are more suitable than MPCs applicable only in FSI. Another possible application of BSI to FPAs is a concentric circular grating so called a bulls-eye antenna which also has been investigated only on the FSI scheme. If the CMS in FIG. 9A is replaced by a concentric circular grooved surface which generates strong electric field above the metal surface at the center by SPW effects, the detector size can be reduced to collect the photocurrent enhanced by this locally intensified electric field. The resulting structure is then very similar to a commercial dish antenna but its collecting principle entirely relies on surface plasmonic effects. As previously explained, such reduction of detector size can result in better signal-to-noise ratio of the device which is another promising application of CMS for FPA's.

In summary, a CMS has been proposed for the enhanced photoresponse of FPA's by the coupling of SPW effects. A CMS having of a 2.5 µm-period, 2D square array of 1.1 µm-high, circular posts passivated with a 2.2 µm-thick gold film has been fabricated on the heavily doped, top GaAs contact layer of an InAs QDIP. In BSI, the CMS has strong absorption up to 0.85 in simulation and exhibits ~15-fold enhancement of detectivity compared with the bare QDIP at 77K. Such enhancement can be a result of the direct coupling of the SPWs excited at the CMS/QDIP interface to the absorption region of the detector. Conclusively, CMS is a promising structure that can improve the detectivity of FPAs with surface plasmonic effects by more than an order of one in magnitude.

The discussion has been in the context of QDIP devices, similar concepts would apply to QWIP (quantum well infrared photodetectors). As is well known, these devices have very low response for normal incidence radiation and require a grating or oblique incidence to operate. The MPC discussed above provides an alternative approach. Asymmetric QWIP structures could provide the bias dependence that is provided by the dot structural asymmetry in the QDIP material.

Other semiconductor based detector materials are also possible candidates for SPW enhancement. Strained-layer superlattice (SLS) devices show stronger absorption because the growth can be controlled to have near bulk-like absorption coefficients. However, along with the high quantum efficiency comes larger dark currents. A thinner active region with lower single pass absorption would have a lower dark current. The MPC or CMS coupling to the SPW could be used to regain a near unity quantum efficiency while retaining the low dark current associated with the thinner active region.

A focal plane array (FPA) is a monolithic two-dimensional array of substantially electrically and optically isolated detector elements (pixels) usually indium-bump bonded to a silicon integrated circuit, known as a read-out integrated circuit (ROIC). These FPA arrays are used in infrared cameras as "film" for receiving the incident radiation and producing an infrared picture of a scene. Most of the infrared FPAs produced today are monochrome (black and white) imagers that record a scene across a broadband spectral region that is determined the broadband spectral response of the detector element convolved with the transmission characteristics of the medium (usually air) between the object and the camera.

Recently, there has been substantial activity in developing two-color infrared FPAs by stacking two different detector elements, for example one sensitive in the mid-wave IR (roughly 3- to 5-µm) and another sensitive in the long-wave IR (roughly 8- to 12-µm). QDIP detectors can be designed and fabricated to show sensitivity across both wavelength ranges and can be tuned to a limited degree by varying the polarity and strength of the applied bias. Hyperspectral detectors, which collect information across a large number of small wavelength "bins" require complex filter arrangements that dramatically increase the cost and complexity of hyperspectral FPA solutions and consequently limit their applications.

Since both the polarization and the wavelength response of plasmonics infrared detectors can be controlled by the characteristics of the structured metal film (e.g. wavelength is proportional to the period of the structure and polarization to the aspect ratio, length:width, of the apertures or posts of the structured metal films), plasmonics detectors offer the possibility of tailoring the response characteristics differently for different pixels of the FPA and thereby encoding both the spectral and the polarization information directly into the FPA. This is directly analogous to the very familiar visible color cameras where appropriate filters are applied directly to the FPA pixels in the manufacturing process, encoding the spectral information in the image output.

In the most common manufacturing process used today for infrared FPAs, the pixels are defined after the growth and processing of the active region, the FPA is bump-bonded to the ROIC using indium bumps, and the substrate is thinned, with illumination from the substrate side, often with the addition of an anti-reflective coating to minimize unwanted reflections from the substrate. This process is directly compatible with the use of a CMS structured metal film on a plasmonic detector, since the input radiation is completely decoupled from the very top metal surface of the CMS that provides a convenient surface for the indium bumps. Alternatively, an air-hole based MPC designed for air-side illumination can be integrated into the manufacturing process by fabricating the MPC after the growth, transferring the wafer to a second handle wafer to provide access to the substrate side, removing the substrate and defining the pixels and contacts, bonding to the ROIC, and removal of the handle wafer. Variants to these schemes are well known in the art and can be adapted to the manufacture of plasmonic FPAs.

It will be apparent to those skilled in the art that various modifications and variations can be made in the devices and methods of various embodiments of the invention. Other embodiments will be apparent to those skilled in the art from consideration of the specification and practice of the embodiments disclosed herein. It is intended that the specification and examples be considered as examples only. The various embodiments are not necessarily mutually exclusive, as some embodiments can be combined with one or more other embodiments to form new embodiments. The current configuration discussed is one embodiment. Other possible embodiments are envisioned and include, but are not limited to: 1) Use of different pitches in the x- and y-directions, that is, a detector whose spectral response is a function of polarization. 2) Control of the hole size to adjust the SPW to incident radiation coupling. 3) Use of multiple pitches (Moiré patterns) within a single pixel. To a first approximation this should provide independent SPW resonance bands. There will be some cross coupling and this may provide additional useful spectral features. 4) Adjusting the hole shape to optimize the response function. One class of shapes is ellipses, of which a round hole is a limiting case. For elongated ellipses with nonequal major and minor axes there will be a polarization response that might be of practical use. A limiting case is a simple slit grating with the slits extending all the way across the detector element. This will provide a strong polarization response with a strong SPW generation for the E-field perpendicular to the slits and virtually no response for the E-field parallel to the slit. 5) Another possibility is adjusting the shape of the holes from circular to some other shape. Particular examples include, but are not restricted to, squares, annular rings, triangles, bow-tie antennae, etc. Each of these shapes has been shown to have some advantages in terms of field enhancement or transmission. 6) Use of a dielectric underlayer between the MPC and the semiconductor. This layered structure can be used to vary the transverse decay length ($\delta$) of the SPW to adjust the overlap between the field strength and the absorption region. 7) For array detectors, it is of course not necessary to have the same pattern on each pixel. For example it might be desirable to implement different polarization and spectral responses across the detector. Systematically varying the pattern across an array will provide polarization or spectral diversity across the array.

It is noted that, as used in this specification and the appended claims, the singular forms "a," "an," and "the," include plural referents unless expressly and unequivocally limited to one referent. Thus, for example, reference to "a wavelength" includes two or more different wavelengths. As used herein, the term "include" and its grammatical variants are intended to be non-limiting, such that recitation of items in a list is not to the exclusion of other like items that can be substituted or other items that can be added to the listed items.

What is claimed is:

1. A plasmonic detector device comprising:
a photon detector element comprising an absorption region disposed between a first doped contact layer and a second doped contact layer;
optionally, none or at least one of a dielectric film disposed on the first doped contact layer; and
a metal film over the first doped contact layer,
wherein the metal film, the at least one dielectric film if present, the first and second doped contact layers, the absorption region and other layers of the detector support at least one surface plasma wave that propagates substantially parallel to a surface of the metal film that is closest to the absorption region,
wherein at least one of the first doped contact layer, the metal film and the at least one dielectric film if present, comprise a periodic structure to provide coupling between incident radiation and the at least one surface plasma wave, and
wherein the absorption region of the detector element is within a lateral extent of the surface plasma wave.

2. The device according to claim 1, wherein the metal film comprises a metal-photonic crystal (MPC) perforated with a periodic array of apertures, wherein a Fourier transform of the array of apertures is arranged to provide at least one Fourier component that couples incident radiation at a design wavelength of interest into the at least one surface plasma wave.

3. The device according to claim 2, wherein the incident illumination comprises infrared illumination incident from a top of the metal photonic crystal.

4. The device according to claim 1, wherein the metal film comprises a corrugated metal surface (CMS) having an array of corrugations, wherein a Fourier transform of the array of corrugations is arranged to provide at least one Fourier component that couples incident radiation at a design wavelength of interest into the at least one surface plasma wave.

5. The device according to claim 4, wherein the incident illumination comprises infrared illumination incident from a substrate on which the detector element is disposed.

6. The device according to claim 1, wherein the at least one dielectric film comprises a plurality of structured dielectric films, and the metal film comprises an unstructured metal film formed on the structured dielectric films, wherein a Fourier transform of the structured dielectric films is arranged to provide at least one Fourier component that couples incident radiation at a design wavelength of interest into the at least one surface plasma wave.

7. The device according to claim 1, where the at least one dielectric film comprises at least one planar dielectric film and at least one structured dielectric film and the at least one dielectric film is interspersed between a top of the detector and a bottom of the metal film, allowing control of the surface plasma wave characteristics, the coupling strength and the electrical properties of a contact region.

8. The device according to claim 1, where the detector element is any of: a quantum-well infrared detector (QWIP); a quantum-dot infrared detector (QDIP); a strained layer superlattice (SLS) infrared detector; a HgCdTe infrared detector; an InSb infrared detector; and any thin-film or bulk infrared detector.

9. A plasmonic detector comprising:
a substrate;
a quantum dot infrared photodetector (QDIP) element disposed on the substrate, the QDIP element comprising an absorption region of at least one quantum dot stack disposed between a first doped contact layer and a second doped contact layer;
optionally, none or at least one of a dielectric film disposed on the first doped contact layer;
a metal film over the first doped contact layer, wherein the metal film comprises a periodic array of features,
wherein the metal film, the at least one dielectric film if present, the first and second doped contact layers, the absorption region and other layers of the detector support at least one surface plasma wave that propagates substantially parallel to a surface of the metal film that is closest to the absorption region,
wherein the metal film, the at least one dielectric film, if present, and the first and second doped contact layers provide coupling between incident radiation and the at least one surface plasma wave, and
wherein the absorption region of the QDIP element is within a lateral extent of the surface plasma wave.

10. The detector of claim 9, wherein a ratio of a spectral response between surface plasma wave features substantially at $\lambda \sim pn$ and $\lambda \sim pn/\sqrt{2}$ corresponds to polarity and magnitude of a bias voltage applied to the photodetector and a pattern period of the array of features to the photoresponse of the photodetector, where $\lambda$, p, and n are surface plasma resonance wavelength, pattern period, and a refractive index of the absorption region, respectively.

11. The detector of claim 9, wherein the at least one dielectric film comprises at least one planar dielectric film and at least one structured dielectric film disposed between the first doped contact layer and the metal film.

12. A plasmonic detector comprising:
a substrate;
a quantum well infrared photodetector (QWIP) element disposed on the substrate, the QWIP element comprising an absorption region disposed between a first doped contact layer and a second doped contact layer;
optionally, none or at least one of a dielectric film disposed on the first doped contact layer; and a metal film over the first doped contact layer, wherein the metal film comprises a periodic array of features, wherein the metal film, the at least one dielectric film if present, the first and second doped contact layers, the absorption region and other layers of the detector support at least one surface plasma wave that propagates substantially parallel to a surface of the metal film that is closest to the absorption region, wherein the metal film, the at least one dielectric film, if present, and the first and second doped contact layers provide coupling between incident radiation and the at least one surface plasma wave, and wherein the absorption region of the QWIP element is within a lateral extent of the surface plasma wave.

13. A plasmonics detector comprising:
a substrate;
a strained layer superlattice (SLS) absorption region disposed on the substrate between a first doped contact layer and a second doped contact layer;
optionally, none or at least one of a dielectric thin film disposed on the first doped contact layer; and
a metal film over the first doped contact layer, wherein the metal film comprises a periodic array of features,
wherein the metal film, the at least one dielectric film if present, the first and second doped contact layers, the SLS absorption region and other layers of the detector support at least one surface plasma wave that propagates substantially parallel to a surface of the metal film that is closest to the SLS absorption region,
wherein the structured metal film, the at least one dielectric film, if present, and the first and second doped contact layers provide coupling between incident radiation and the at least one surface plasma wave,
wherein the absorption region of the QDIP element is within a lateral extent of the surface plasma wave; and
wherein integrated absorbance through the SLS is reduced compared to that for a detector without the structured metal film.

14. A method of manufacturing a plasmonic detector comprising:
forming an absorption region between a first doped contact layer and a second doped contact layer;
forming at least one dielectric film on the first doped contact layer; and
forming a metal film over the first doped contact layer,
wherein one or more of the first doped contact layer, the at least one dielectric film and the metal film comprise a periodic pattern to provide coupling of incident radiation to at least one surface plasma wave,
wherein the absorption region, the first and second doped contact layers, the at least one dielectric film and the metal film support the at least one surface plasma wave such that it is capable of propagating substantially parallel to a surface of the metal film that is closest to the absorption region, and
wherein an evanescent field associated with the at least one surface plasma wave extends into the absorption region.

15. A plasmonic detector comprising:
a photon detector element comprising an absorption region disposed between a first doped contact layer and a second doped contact layer;
optionally, none or at least one of a dielectric film disposed on the first doped contact layer; and
a metal film over the first doped contact layer, wherein the metal film comprises a metal-photonic crystal (MPC) perforated with a periodic array of apertures to provide coupling of incident radiation to at least one surface plasma wave,
wherein the absorption region, the first and second doped contact layers, and the metal film support the at least one surface plasma wave such that it is capable of propagating substantially parallel to a surface of the metal film that is closest to the absorption region,
wherein the absorption region is within a lateral extent of the at least one surface plasma wave and
wherein the plasmonic detector is configured to receive incident light from a back side illumination (BSI), and
wherein the MPC enhances a photoresponse in the detector on a side of the metal film as the incident light.

16. A plasmonic focal plane array comprising
a plurality of photon detector elements arranged in a two-dimensional array, each detector element coupled to a read-out integrated circuit (ROIC) for interfacing with external electronics, wherein each of the photon detector elements comprise
an absorption region disposed between a first doped contact layer and a second doped contact layer;
optionally none or at least one of a dielectric film disposed on the first doped contact layer; and
a metal film over the first doped contact layer,
wherein the metal film, the at least one dielectric film if present, the first and second doped contact layers, the absorption region and other layers of the detector support at least one surface plasma wave that propagates substantially parallel to a surface of the metal film that is closest to the absorption region,
wherein at least one of the first doped contact layer, the metal film and the at least one dielectric film if present, comprise a periodic structure to provide coupling between incident radiation and the at least one surface plasma wave, and
wherein the absorption region of the infrared detector element is within a lateral extent of the surface plasma wave.

17. The plasmonic focal plane array according to claim 16, wherein each detector element (pixel) has substantially identical optical characteristics.

18. The plasmonic focal plane array according to claim 16, wherein the metal surface of each corresponding detector element provides a different spectral and polarization response on different detector elements (pixels) so as to encode spectral and polarization information in the output of the ROIC.

19. A method of manufacturing a plasmonic focal plane array, comprising
forming a plurality of photon detector elements arranged in a two-dimensional array, wherein each detector element is formed by
forming an absorption region between a first doped contact layer and a second doped contact layer;
forming at least one dielectric film on the first doped contact layer; and
forming a metal film over the first doped contact layer,
wherein one or more of the first doped contact layer, the at least one dielectric film and the metal film comprise a periodic pattern to provide coupling of incident radiation to at least one surface plasma wave,
wherein the absorption region, the first and second doped contact layers, the at least one dielectric film and the metal film support the at least one surface plasma wave such that it is capable of propagating substantially parallel to a surface of the metal film that is closest to the absorption region, and
wherein an evanescent field associated with the at least one surface plasma wave extends into the absorption region; and
coupling each detector element to a read-out integrated circuit (ROIC) for interfacing with external electronics,
wherein each of the plasmonics detector elements are arranged for back side illumination, are optically decoupled from the detector array, and are indium-bump bonded to the ROIC without impacting the focal plane array performance.

20. A method for enhancing photoresponse, spectral tunability, and polarization dependence of a plasmonic detector element, comprising:
  providing the photon detector element, wherein the photon detector element comprises
    an absorption region disposed between a first doped contact layer and a second doped contact layer;
    optionally none or at least one of a dielectric film disposed on the first doped contact layer; and
    a metal film over the doped contact layer,
    wherein the metal film, the at least one dielectric film if present, the first and second doped contact layers, the absorption region and other layers of the detector support at least one surface plasma wave that propagates substantially parallel to a surface of the metal film that is closest to the absorption region,
  patterning at least one of the first doped contact layer, the metal film and the at least one dielectric film, if present, as a periodic structure to provide coupling between incident radiation and the at least one surface plasma wave, wherein the absorption region of the detector element is within a lateral extent of the surface plasma wave,
  wherein the patterning comprises at least one selected from perforating the metal film with a periodic array of holes to form a metal-photonic crystal (MPC) and forming the at least one dielectric layer, if present, as a periodic array of posts with the metal film disposed thereon to form a corrugated metal surface (CMS), and wherein a period, shape, size, and height of the holes and posts are preselected.

* * * * *

UNITED STATES PATENT AND TRADEMARK OFFICE
CERTIFICATE OF CORRECTION

PATENT NO. : 8,835,851 B2  
APPLICATION NO. : 13/502987  
DATED : September 16, 2014  
INVENTOR(S) : Seung-Chang Lee, Sanjay Krishna and Steven Brueck Page 1 of 1

It is certified that error appears in the above-identified patent and that said Letters Patent is hereby corrected as shown below:

In the Claims

Column 18, claim 9, line 33, "on the first doped contact layer;" should read --on the first doped contact layer, and--.

Signed and Sealed this  
Twelfth Day of May, 2015

Michelle K. Lee  
*Director of the United States Patent and Trademark Office*